United States Patent
Chang et al.

(10) Patent No.: US 12,388,039 B2
(45) Date of Patent: Aug. 12, 2025

(54) 3D IC COMPRISING SEMICONDUCTOR SUBSTRATES WITH DIFFERENT BANDGAPS

(71) Applicant: Taiwan Semiconductor Manufacturing Company, Ltd., Hsinchu (TW)

(72) Inventors: Yao-Chung Chang, Zhubei (TW); Shih-Chien Liu, Hsinchu County (TW); Chia-Jui Yu, Hsinchu County (TW); Chun-Lin Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 450 days.

(21) Appl. No.: 17/848,815

(22) Filed: Jun. 24, 2022

(65) Prior Publication Data

US 2023/0326890 A1    Oct. 12, 2023

Related U.S. Application Data

(60) Provisional application No. 63/329,544, filed on Apr. 11, 2022.

(51) Int. Cl.
*H01L 23/00* (2006.01)
*H01L 23/66* (2006.01)
*H01L 25/00* (2006.01)
*H01L 25/065* (2023.01)

(52) U.S. Cl.
CPC .............. *H01L 24/08* (2013.01); *H01L 23/66* (2013.01); *H01L 24/80* (2013.01); *H01L 25/0657* (2013.01); *H01L 25/50* (2013.01); *H01L 2223/6677* (2013.01); *H01L 2224/08145* (2013.01); *H01L 2224/80006* (2013.01); *H01L 2224/80895* (2013.01); *H01L 2224/80896* (2013.01); *H01L 2924/10253* (2013.01); *H01L 2924/1033* (2013.01); *H01L 2924/13064* (2013.01); *H01L 2924/14252* (2013.01)

(58) Field of Classification Search
CPC .......... H01L 24/08; H01L 23/66; H01L 24/80
See application file for complete search history.

(56) References Cited

U.S. PATENT DOCUMENTS

| | | | |
|---|---|---|---|
| 9,640,445 | B1 | 5/2017 | Hwang |
| 2015/0282367 | A1 | 10/2015 | Barth et al. |
| 2018/0005988 | A1 | 1/2018 | Deligianni et al. |
| 2018/0145052 | A1 | 5/2018 | Dasgupta et al. |
| 2018/0233485 | A1* | 8/2018 | Lin ................... H01L 24/16 |
| 2019/0043914 | A1 | 2/2019 | Von Kaenel |

(Continued)

*Primary Examiner* — Thao P Le
(74) *Attorney, Agent, or Firm* — Eschweiler & Potashnik, LLC

(57) ABSTRACT

Various embodiments of the present disclosure are directed towards a three-dimensional (3D) IC comprising semiconductor substrates with different bandgaps. The 3D IC chip comprises a first IC chip and a second IC chip overlying and bonded to the first IC chip. The first IC chip comprises a first semiconductor substrate with a first bandgap, and further comprises and a first device on and partially formed by the first semiconductor substrate. The second IC chip comprises a second semiconductor substrate with a second bandgap different than the first bandgap, and further comprises a second device on the second semiconductor substrate.

20 Claims, 29 Drawing Sheets

(56) References Cited

U.S. PATENT DOCUMENTS

| | | | |
|---|---|---|---|
| 2020/0006324 A1 | 1/2020 | Chen et al. | |
| 2020/0135790 A1* | 4/2020 | Kim | H10F 39/804 |
| 2020/0328186 A1* | 10/2020 | Liu | H01L 24/83 |
| 2021/0066241 A1* | 3/2021 | Watanabe | H01L 24/92 |
| 2021/0091061 A1 | 3/2021 | Fiorenza et al. | |
| 2021/0151408 A1 | 5/2021 | Yu et al. | |
| 2022/0028741 A1* | 1/2022 | Dumka | H01L 21/6835 |
| 2022/0115292 A1* | 4/2022 | Choi | H10N 19/101 |
| 2022/0302108 A1* | 9/2022 | Thei | H01L 23/562 |
| 2023/0069315 A1* | 3/2023 | Chang | H01L 25/0657 |
| 2024/0063160 A1* | 2/2024 | Lu | H01L 24/80 |

\* cited by examiner

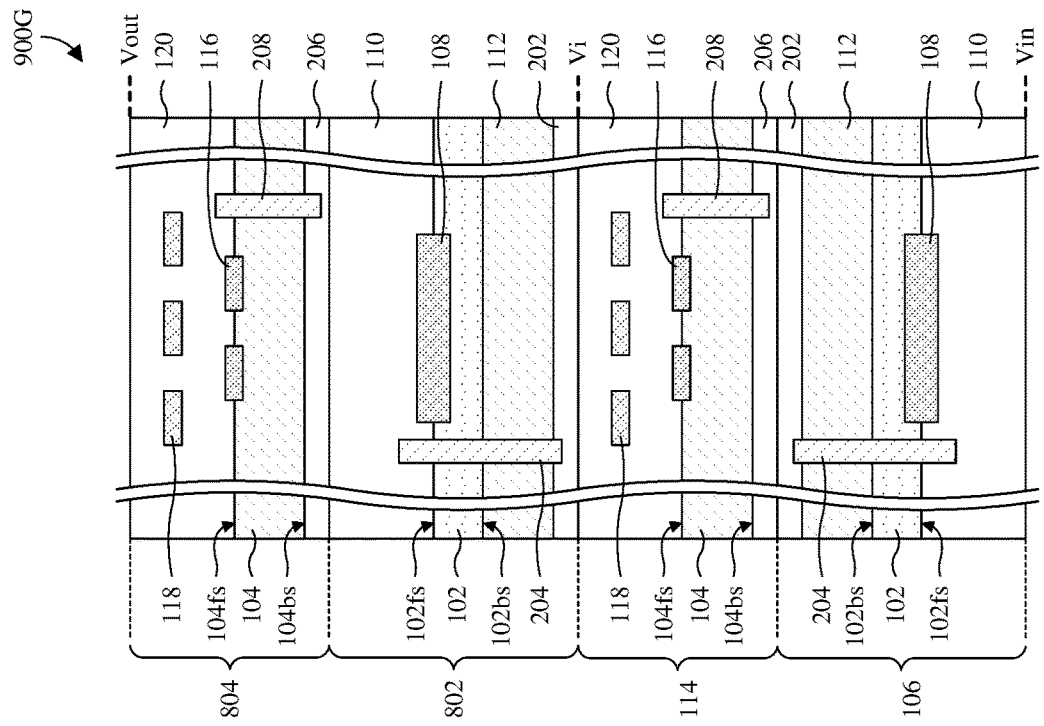
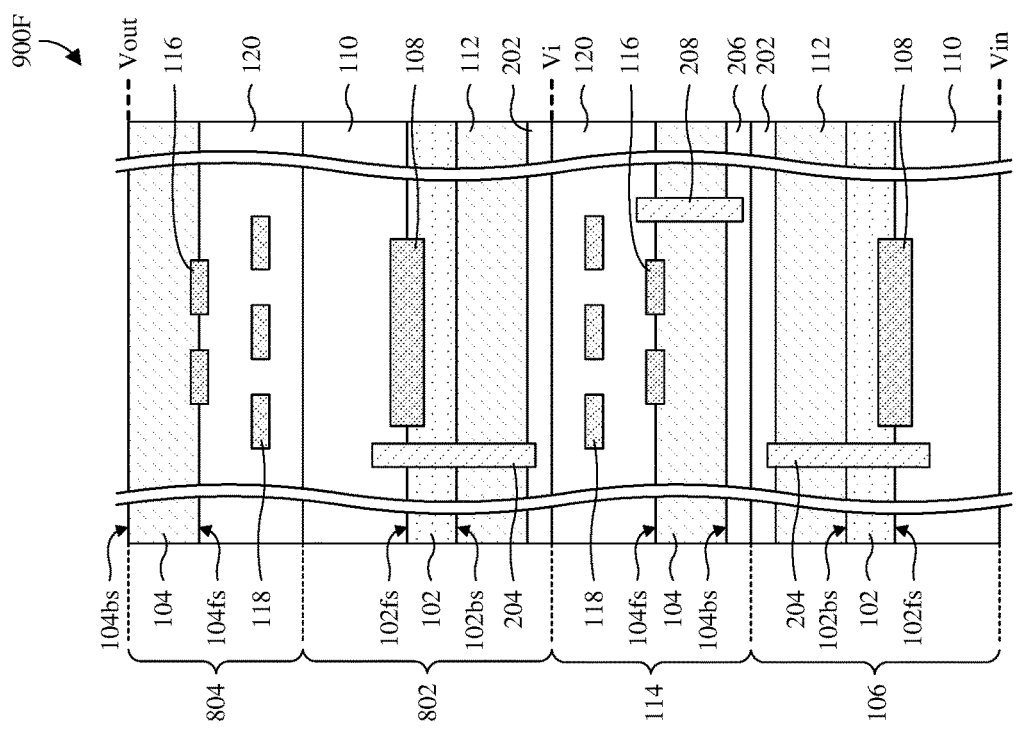

3D IC COMPRISING SEMICONDUCTOR SUBSTRATES WITH DIFFERENT BANDGAPS

REFERENCE TO RELATED APPLICATION

This application claims the benefit of U.S. Provisional Application No. 63/329,544, filed on Apr. 11, 2022, the contents of which are incorporated by reference in their entirety.

BACKGROUND

Semiconductor devices based on silicon have been the standard for the past few decades. However, semiconductor devices based on gallium nitride (GaN) and the like are increasingly used for power supply/converter applications and radio frequency (RF) applications. Compared to silicon-based semiconductor devices, semiconductor devices based on GaN and the like have wide bandgaps. Among other things, the wide bandgaps enable operation at high frequencies, high voltages, and high temperatures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-9H illustrate cross-sectional views of some alternative embodiments of the 3D IC of FIG. 8 in which orientations of IC chips of the 3D IC are varied.

DETAILED DESCRIPTION

Figure 1:
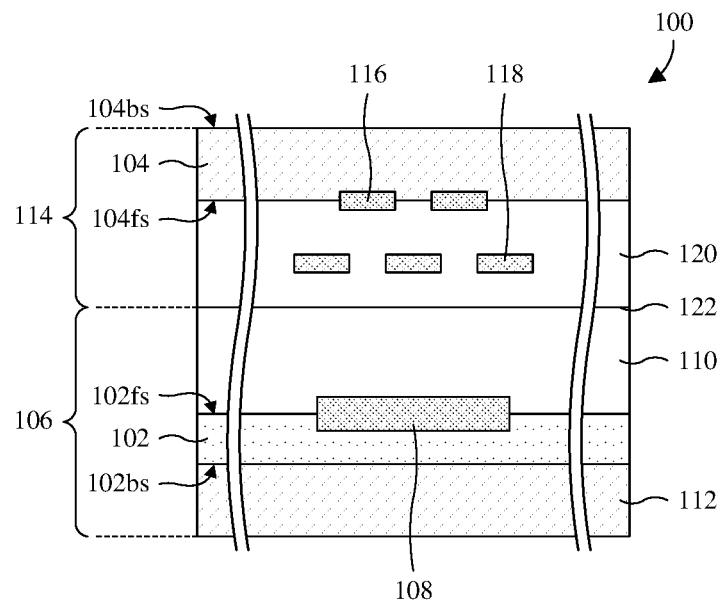
FIG. 1 illustrates a cross-sectional view of some embodiments of a three-dimensional (3D) integrated circuit (IC) comprising semiconductor substrates with different bandgaps.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Compared to silicon-based counterparts, gallium nitride (GaN) devices may have smaller resistance-capacitance (RC) parasitic elements, which allow the GaN devices to operate at high frequencies. Accordingly, GaN devices find application in radio frequency (RF). For example, GaN devices may find application within monolithic microwave integrated circuits (MMICs) used for fifth generation (5G) wireless communication.

An MMIC may be formed by forming both passive and active devices on a GaN substrate. However, forming the active and passive devices using GaN may be more costly than forming the active and passive devices using silicon. Further, there may be little to no performance advantage to forming the passive devices using GaN compared to silicon. Accordingly, costs may be overly high. An MMIC may alternatively be formed by forming the active devices on a GaN substrate, and by forming the passive devices on a silicon substrate. The passive and active devices may then be packaged together so as to laterally electrically couple the passive and active devices together. However, this increases the wire length between the passive and active devices, which enlarges RC parasitic elements. Accordingly, RF performance may be poor, especially for high operating frequencies.

In addition to high operating frequencies, GaN devices may have high operating temperatures and high operating voltages compared to silicon counterparts. Accordingly, GaN devices find application within power supplies and/or power converters. As an example, GaN devices may find application within analog-to-digital converters (ADC), digital-to-analog converters (DAC), power supplies for computer servers, and so on.

Such a computer server power supply may comprise a full-bridge converter integrated circuit (IC) chip and a logical link control (LLC) converter IC chip. The two IC chips may be bonded to a printed circuit board (PCB) and electrically coupled together through the PCB and/or wire bonds. Further, the full-bridge converter IC chip may comprise GaN devices on a first GaN substrate, and the LLC IC chip may comprise GaN device on a second GaN substrate. However, use of two separate IC chips may increase size and may further increase cost (e.g., from electrically coupling the two IC chips together). Further, use of two separate IC chips increases wire length between the GaN devices, which increases parasitic inductance and capacitance and hence degrades performance. Further yet, the full-bridge converter IC chip and/or the LLC IC chip may comprise devices for which GaN provides little to no benefit. As such, costs may be overly high from forming theses devices using GaN.

Various embodiments of the present disclosure are directed towards a three-dimensional (3D) IC comprising semiconductor substrates with different bandgaps. The 3D IC chip comprises a first IC chip and a second IC chip overlying and bonded to the first IC chip. The first IC chip comprises a first semiconductor substrate with a first bandgap, and further comprises and a first device on the first semiconductor substrate. In some embodiments, the first device is formed in part by the first semiconductor substrate, whereby the first device may also be referred to as a first semiconductor device. The second IC chip comprises a second semiconductor substrate with a second bandgap different than the first bandgap, and further comprises a second device on the second semiconductor substrate. In some embodiments, the second device is formed in part by the second semiconductor substrate, whereby the second device may also be referred to as a second semiconductor device.

The 3D IC chip may, for example, find application with power applications and RF applications in at least some embodiments in which the first and second semiconductor substrates correspond to GaN and silicon. For example, components of an RF circuit (e.g., a transceiver, a front-end module (FEM), an MMIC, and so on) or components of a power circuit (e.g., a full-bridge converter, an LLC converter, and so on) may be split amongst the first and second IC chips and interconnect by interconnect structures of the IC chips. Devices that benefit from the wide bandgap of GaN (e.g., the first device) may be formed on the first semiconductor substrate, whereas devices that don't benefit or minimally benefit from the wide bandgap of GaN (e.g., the second device) may be formed at reduced cost on the second semiconductor substrate.

Additionally, because the first and second IC chips are vertically stacked, wire length between the first and second IC chips is small and area consumed by the 3D IC is small. The small wire lengths may lead to reduced parasitic inductance and capacitance and may hence lead to enhanced performance. The small area may allow enhanced functional density on a PCB or other substrate to which the 3D IC is mounted and may hence allow reduced costs.

With reference to FIG. 1, a cross-sectional view 100 of some embodiments of a 3D IC comprising a first semiconductor substrate 102 and a second semiconductor substrate 104 is provided in which the first and second semiconductor substrates 102, 104 have different bandgaps. For example, the first semiconductor substrate 102 may have a larger or wider bandgap than the second semiconductor substrate 104 or vice versa.

The first semiconductor substrate 102 is part of a first IC chip 106, which comprises a first active device 108, a first frontside interconnect structure 110, and a support substrate 112. The support substrate 112 is on a backside 102$bs$ of the first semiconductor substrate 102, and the first active device 108 and the first frontside interconnect structure 110 are on a frontside 102$fs$ of the first semiconductor substrate 102 opposite the backside 102$bs$. In alternative embodiments, the support substrate 112 is omitted from the 3D IC. Further, the first active device 108 is between the first semiconductor substrate 102 and the first frontside interconnect structure 110 and is partially formed by the first semiconductor substrate 102. As such, the first active device 108 may also be referred to as a first semiconductor device.

The second semiconductor substrate 104 is part of a second IC chip 114, which overlies and is bonded to the first IC chip 106. The second IC chip 114 comprises a plurality of second active devices 116, a plurality of passive devices 118, and a second frontside interconnect structure 120 on a frontside 104$fs$ of the second semiconductor substrate 104, opposite a backside 104$bs$ of the second semiconductor substrate 104. The second active devices 116 are between the second semiconductor substrate 104 and the second frontside interconnect structure 120 and are partially formed by the second semiconductor substrate 104. As such, the second active devices 116 may also be referred to as second semiconductor devices. Further, the passive devices 118 are in the second frontside interconnect structure 120. In alternative embodiments, one, some, or all of the passive devices 118 is/are in the first frontside interconnect structure 110.

In some embodiments, the first semiconductor substrate 102 has a larger bandgap than the second semiconductor substrate 104. For example, the first semiconductor substrate 102 may be or comprise GaN or the like, whereas the second semiconductor substrate 104 may be or comprise monocrystalline silicon or the like. In at least some of such embodiments, the 3D IC chip may find application with power applications and RF applications. For example, the 3D IC may be or otherwise comprise a transceiver, a FEM, an MMIC, or some other suitable RF device. As another, the 3D IC may be or otherwise comprise a full-bridge power converter, an LLC power converter, or some other suitable power device.

To the extent that the first semiconductor substrate 102 has a larger bandgap than the second semiconductor substrate 104, active devices that benefit from the larger bandgap (e.g., the first active device 108) are on and partially formed by the first semiconductor substrate 102. Active devices used for power supplies, power conversion, RF switching, RF amplification, and so on tend to benefit from the larger bandgap because the larger bandgap enables operation at higher frequencies, higher voltages, and higher temperatures. Further, active devices that don't benefit or minimally benefit from the larger bandgap of the first semiconductor substrate 102 (e.g., the second active devices 116) may be formed on the second semiconductor substrate 104. At least when the second semiconductor substrate 104 is or comprises monocrystalline silicon, this may reduce costs because forming active devices on non-silicon substrates tends to be more costly than forming active devices on silicon substrates.

Additionally, because the first and second IC chips 106, 114 are vertically stacked, wire length between the first and second IC chips 106, 114 is small and area consumed by the 3D IC is small. The small wire lengths may lead to reduced parasitic inductance and capacitance and may hence enhance performance. For example, compared to wire bonding the first and second IC chips 106, 114 together when laterally bordering, parasitic inductance may be reduced from 3.2 nanohenries to 0.4 nanohenries for an 88% reduction. Other suitable values are, however, amenable. The small area may allow enhanced functional density on a PCB or other substrate to which the 3D IC is mounted and may hence reduce costs.

With continued reference to FIG. 1, the first and second IC chips 106, 114 are vertically stacked and bonded together frontside to frontside at a bond interface 122. By frontside to frontside, it is meant that first and second IC chips 106, 114 are bonded together at the bond interface 122 so the frontside 102fs of the first semiconductor substrate 102 and the frontside 104fs of the second semiconductor substrate 104 face each other. The bonding both physical secures the first and second IC chips 106, 114 to each other and electrically couples the first and second IC chips 106, 114 to each other.

The first and second frontside interconnect structures 110, 120 define conductive paths electrically coupling the first and second active devices 108, 116 and the passive devices 118 together to form a circuit. The circuit may, for example, be a full-bridge power converter, an LLC power converter, a transceiver, a FEM, an MMIC, or the like. As seen hereafter, the first and second frontside interconnect structures 110, 120 may comprise stacks of conductive features (not shown) embedded in corresponding dielectric layers (not shown). The conductive features define the conductive paths and may, for example, comprise vias, contacts, wires, pads, other suitable types of conductive features, or any combination of the foregoing.

In some embodiments, the first semiconductor substrate 102 is or comprises GaN or some other suitable group III-V semiconductor material. In some embodiments, the first semiconductor substrate 102 comprises a GaN layer and an aluminum gallium nitride (AlGaN) layer overlying and directly contacting the GaN layer at a heterojunction. In some embodiments, the first semiconductor substrate 102 has a bandgap greater than a bandgap of silicon and/or greater than a bandgap of the second semiconductor substrate 104. In some embodiments, the first semiconductor substrate 102 has a bandgap greater than about 1.5 electron volts, about 2 electron volts, about 2.5 electron volts, or some other suitable value.

In some embodiments, the support substrate 112 is or comprises monocrystalline silicon, silicon carbide, sapphire, or some other suitable semiconductor material. In some embodiments, the first semiconductor substrate 102 and the support substrate 112 form a composite substrate. For example, to the extent that the first semiconductor substrate 102 is or comprises GaN and the support substrate 112 is monocrystalline silicon, silicon carbide, or sapphire, the composite substrate may be or comprise a GaN on silicon substrate, a GaN on silicon carbide substrate, or a GaN on sapphire substrate. In some embodiments, the support substrate 112 is or comprises a same semiconductor material as the second semiconductor substrate 104 and/or has a lesser bandgap than the first semiconductor substrate 102.

In some embodiments, the support substrate 112 has a high resistance to reduce substrate losses for RF applications and the like. The high resistance may, for example, be greater than about 1 kilo-ohms/centimeter (kΩ/cm), about 1.8 kΩ/cm, or about 3 kΩ/cm, and/or may, for example, be about 1-1.8 kΩ/cm or about 1.8-3 kΩ/cm. In other embodiments, the support substrate 112 has a low resistance less than about 30 Ω/cm, about 20 Ω/cm, or about 10 Ω/cm. In yet other embodiments, the support substrate 112 has a resistance that is about 100-500 Ω/cm, about 100-300 Ω/cm, or about 300-500 Ω/cm. Notwithstanding the foregoing resistance values, other suitable values are amenable in alternative embodiments.

In some embodiments, the second semiconductor substrate 104 is or comprises monocrystalline silicon or some other semiconductor material. In some embodiments, the second semiconductor substrate 104 has a lesser bandgap than the first semiconductor substrate 102. In some embodiments, the second semiconductor substrate 104 has a bandgap within about 0.5, 0.4, 0.2, or 0.1 electron volts of a bandgap of silicon and/or has a bandgap of about 0.5-1.5 electron volts. Alternative bandgaps are, however, amenable.

In some embodiments, the first semiconductor substrate 102 is or comprises GaN, the second semiconductor substrate 104 is or comprises monocrystalline silicon, the support substrate 112 is or comprises monocrystalline silicon, the first active device 108 is a high-electron-mobility transistor (HEMT), and the second active devices 116 are metal-oxide-semiconductor field-effect transistors (MOSFETs). Different material types and/or device types are, however, amenable in alternative embodiments.

In some embodiments, the first active device 108 is a HEMT, a MOSFET, or some other suitable type of active device. In some embodiments, the second active devices 116 are MOSFETs or some other suitable type of active device. The MOSFETs may, for example, be a fin field-effector transistors (finFETs), gate-all-around field-effect transistors (GAA FETs), nanosheet field-effect transistors, some other suitable type of MOSFET, or any combination of the foregoing. In some embodiments, the second active devices 116 correspond to complementary metal-oxide semiconductor (CMOS) semiconductor devices and hence correspond to an n-type MOSFET and a p-type MOSFET. In some embodiments, the passive devices 118 are or comprise capacitors, resistors, inductors, transformers, some other suitable type of passive device, or any combination of the foregoing.

As noted above, the first and second active devices 108, 116 and the passive devices 118 together to form a circuit. In some embodiments, the first active device 108 corresponds to an analog portion of the circuit, whereas the second active devices 116 correspond to a digital portion of the circuit. Further, in some embodiments, the first active device 108 corresponds to power supply and/or conversion portions of the circuit, whereas the second active devices 116 correspond to logic or control portions of the circuit.

With reference to FIGS. 2A-2H, cross-sectional views 200A-200H of some alternative embodiments of the 3D IC of FIG. 1 are provided in which the first and second IC chips 106, 114 of the 3D IC are varied.

Figure 2A:
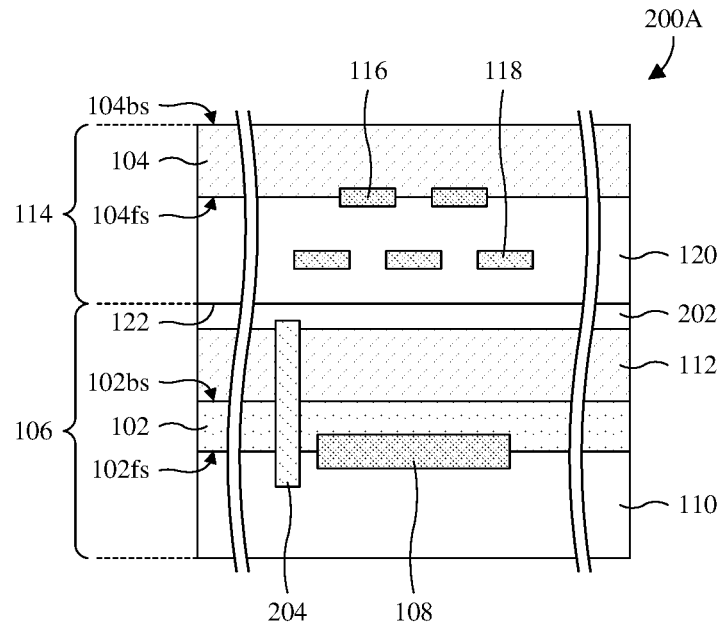
FIGS. 2A-2H illustrate cross-sectional views of some alternative embodiments of the 3D IC of FIG. 1 in which IC chips of the 3D IC are varied.

As illustrated by the cross-sectional view 200A of FIG. 2A, the first IC chip 106 is vertically flipped, such that the first and second IC chips 106, 114 are bonded together backside to frontside at the bond interface 122. As a result, the first IC chip 106 further comprises a backside interconnect structure 202 and a through substrate vias (TSV) 204.

The backside interconnect structure 202 overlies the first semiconductor substrate 102 and the support substrate 112 on the backside 102bs of the first semiconductor substrate 102, and the TSV 204 extends through the first semiconductor substrate 102 and the support substrate 112 from the backside interconnect structure 202 to the first frontside interconnect structure 110. The backside interconnect structure 202 defines a conductive path electrically coupling the TSV 204 to the second frontside interconnect structure 120, and the TSV 204 defines a conductive path electrically coupling the backside interconnect structure 202 to the first frontside interconnect structure 110. As seen hereafter, the backside interconnect structure 202 may comprise a stack of conductive features (not shown) embedded in a corresponding dielectric layer (not shown). The conductive features define conductive paths and may, for example, comprise vias, wires, pads, redistribution layers (RDLs), and so on.

Figure 2B:
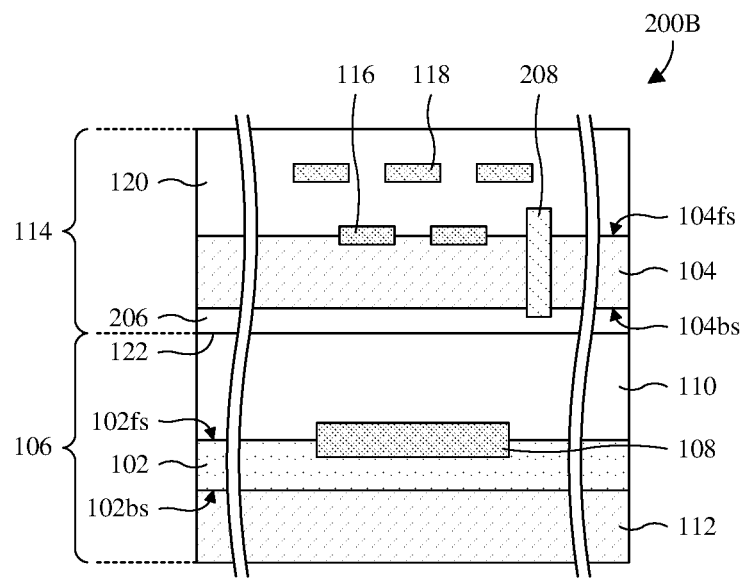

As illustrated by the cross-sectional view 200B of FIG. 2B, the second IC chip 114 is vertically flipped, such that the first and second IC chips 106, 114 are bonded together frontside to backside at the bond interface 122. As a result, the second IC chip 114 further comprises a backside interconnect structure 206 and a TSV 208.

The backside interconnect structure 206 underlies the second semiconductor substrate 104 on the backside 104bs of the second semiconductor substrate 104, and the TSV 208 extends through the second semiconductor substrate 104 from the backside interconnect structure 206 to the second frontside interconnect structure 120. The backside interconnect structure 206 defines a conductive path electrically coupling the TSV 208 to the first frontside interconnect structure 110, and the TSV 208 defines a conductive path electrically coupling the backside interconnect structure 206 to the second frontside interconnect structure 120. As seen hereafter, the backside interconnect structure 206 may comprise a stack of conductive features (not shown) embedded in a corresponding dielectric layer (not shown). The conductive features define conductive paths and may, for example, comprise vias, wires, pads, RDLs, and so on.

Figure 2C:
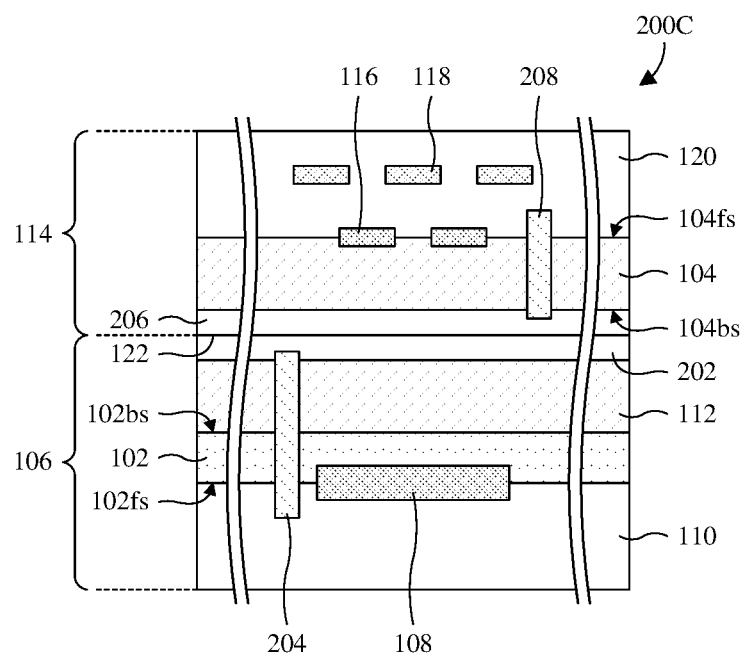

As illustrated by the cross-sectional view 200C of FIG. 2C, the first and second IC chips 106, 114 are each vertically flipped, such that the first and second IC chips 106, 114 are bonded together backside to backside at the bond interface 122. The first IC chip 106 is as in FIG. 2A, whereas the second IC chip 114 is as in FIG. 2B.

Figure 2D:
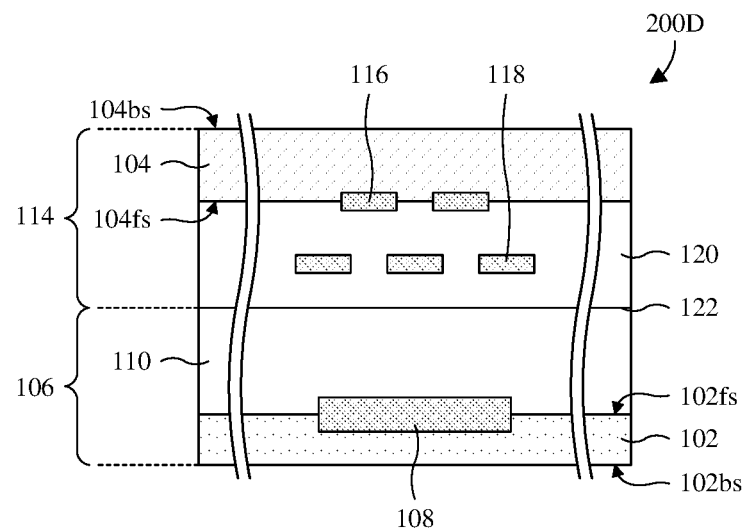

As illustrated by the cross-sectional view 200D of FIG. 2D, the support substrate 112 is omitted. Omitting the support substrate 112 may, for example, reduce RF substrate loss and/or enhance thermal dissipation.

Figure 2E:
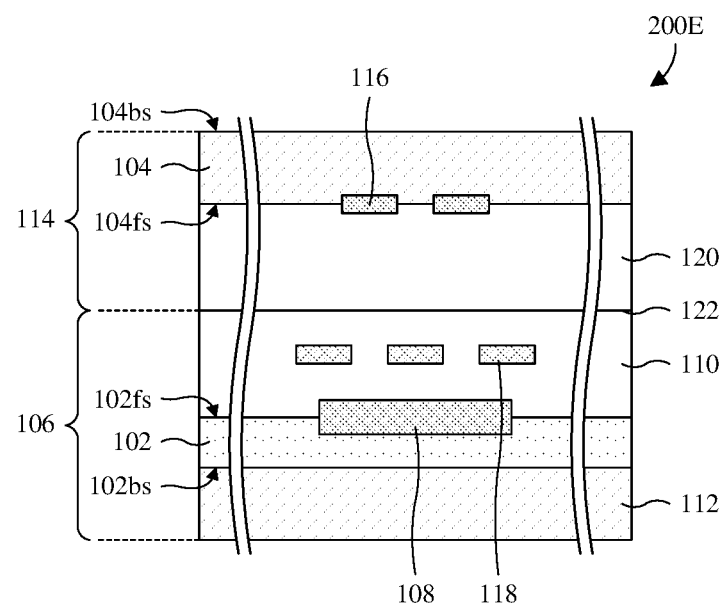

As illustrated by the cross-sectional view 200E of FIG. 2E, the passive devices 118 are in the first frontside interconnect structure 110 instead of the second frontside interconnect structure 120.

Figure 2F:
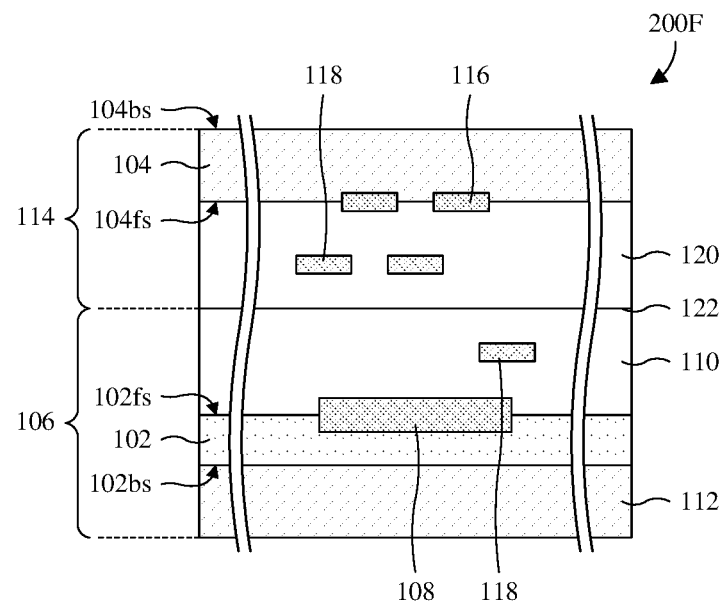

As illustrated by the cross-sectional view 200F of FIG. 2F, the passive devices 118 are split amongst the first and second frontside interconnect structures 110, 120.

Figure 2G:
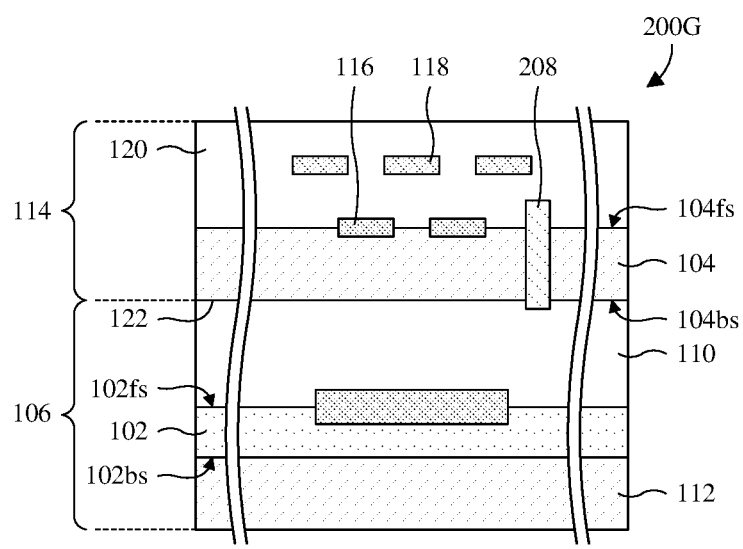

As illustrated by the cross-sectional view 200G of FIG. 2G, the second IC chip 114 is vertically flipped, such that the first and second IC chips 106, 114 are bonded together frontside to backside at the bond interface 122. As a result, the second IC chip 114 is as illustrated and described with regard to FIG. 2B, except that the second IC chip 114 is devoid of the backside interconnect structure 206. Such embodiments may, for example, arise when the second semiconductor substrate 104 is transferred to the first IC chip 106 or is otherwise deposited directly on the first IC chip 106 during manufacture of the 3D IC.

Figure 2H:
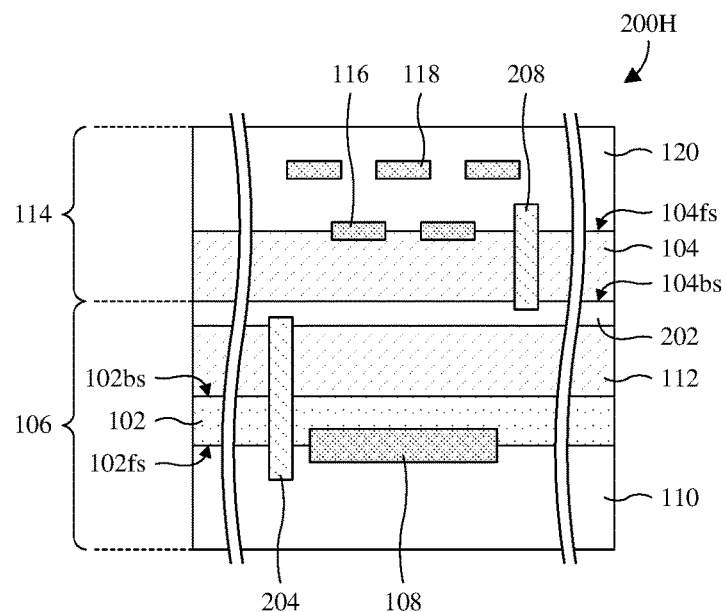

As illustrated by the cross-sectional view 200H of FIG. 2H, the first and second IC chips 106, 114 are each vertically flipped, such that the first and second IC chips 106, 114 are bonded together backside to backside at the bond interface 122. As a result, the first and second IC chips 106, 114 are as illustrated and described with regard to FIG. 2C, except that the second IC chip 114 is devoid of the backside interconnect structure 206. Such embodiments may, for example, arise when the second semiconductor substrate 104 is transferred to the first IC chip 106 or is otherwise deposited directly on the first IC chip 106 during manufacture of the 3D IC.

While FIGS. 2A-2H illustrate modifications to the 3D IC in FIG. 1, the modifications are also applicable to the 3D IC in any of FIGS. 2A-2H. As an example, which is exemplified by FIG. 2D, the support substrate 112 may be omitted in any of FIGS. 2A-2C and 2E-2H. As another example, which is exemplified by FIG. 2E, the passive devices 118 may be in the first frontside interconnect structure 110 in any of FIGS. 2A-2D, 2G, and 2H. As yet another example, which is exemplified by FIG. 2F, the passive devices 118 may be split amongst the first and second frontside interconnect structures 110, 120 in any of FIGS. 2A-2D, 2G, and 2H.

Figure 3:
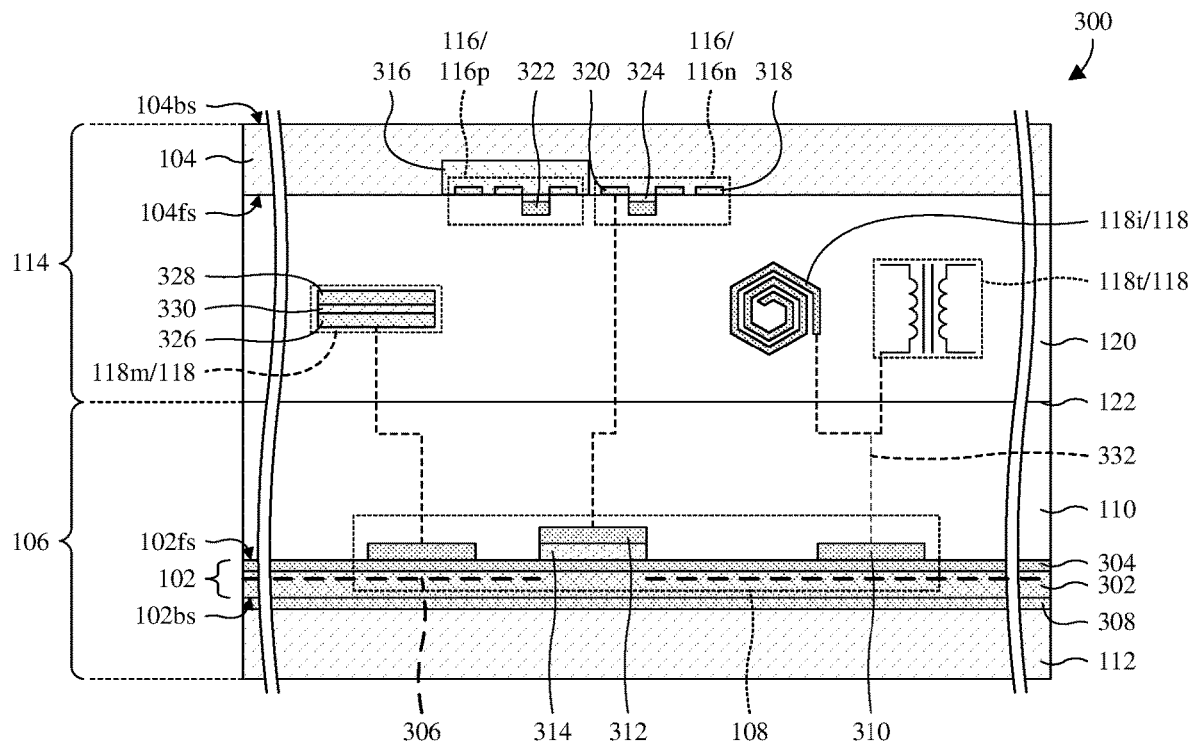
FIG. 3 illustrates a cross-sectional view of some more detailed embodiments of the 3D IC of FIG. 1 in which devices of the 3D IC have additional detail.

With reference to FIG. 3, a cross-sectional view 300 of some more detailed embodiments of the 3D IC of FIG. 1 is provided in which the first and second active devices 108, 116 and the passive devices 118 have additional detail. Additionally, the first semiconductor substrate 102 has additional detail.

The first semiconductor substrate 102 overlies the support substrate 112 and is or comprises a heterojunction structure. Further, the heterojunction structure comprises a channel layer 302 and a barrier layer 304. The channel layer 302 and the barrier layer 304 are semiconductor layers having unequal bandgaps and are or comprise group III-V semiconductor materials, group II-VI semiconductor materials, or the like.

The channel layer 302 underlies and directly contacts the barrier layer 304 at a heterojunction. Further, the channel layer 302 optionally accommodates a two-dimensional carrier gas 306. For example, the channel layer 302 may accommodate a two-dimensional electron gas or a two-dimensional hole gas. The barrier layer 304 is polarized to promote formation of the two-dimensional carrier gas 306. The polarization may, for example, result from spontaneous polarization effects and/or piezoelectric polarization effects.

In some embodiments, the channel layer 302 is or comprises GaN, whereas the barrier layer 304 is or comprises AlGaN. As such, in at least some embodiments, the channel layer 302 is or comprises a group III-V semiconductor (e.g., GaN or the like) and the barrier layer 304 is or comprises the group III-V semiconductor plus an additional element (e.g., aluminum or the like). Notwithstanding the specific semiconductor materials and/or elements enumerated above, other suitable semiconductor materials and/or elements are amenable for the channel layer 302 and the barrier layer 304.

A buffer layer 308 separates the first semiconductor substrate 102 from the support substrate 112. In at least some embodiments in which the support substrate 112 is crystalline, the buffer layer 308 may serve as a seed for epitaxially growing the first semiconductor substrate 102 on the support substrate 112 and/or may buffer mismatches between lattice constants, coefficients of thermal expansion, and so on between the first semiconductor substrate 102 and the support substrate 112. In some embodiments, the buffer layer 308 is a semiconductor layer. Further, in some embodiments in which the channel layer 302 and the barrier layer 304 are respectively GaN and AlGaN, the buffer layer 308 may be or comprise aluminum nitride, AlGaN, GaN, some other suitable material, or any combination of the foregoing.

The first active device 108 is a HEMT, but may be a MOSFET or some other suitable type of active device in alternative embodiments. The first active device 108 comprises a pair of source/drain electrodes 310 and a gate electrode 312 between the source/drain electrodes 310. Further, the first active device 108 comprises a cap layer 314 separating the gate electrode 312 from the first semiconductor substrate 102. Source/drain electrode(s) may refer to a source or a drain, individually or collectively dependent upon the context. The source/drain electrodes 310 and the gate electrode 312 are conductive and may, for example, be metal or the like. The cap layer 314 is a semiconductor material and is polarized to change conductivity of the two-dimensional carrier gas 306 at the gate electrode 312. For example, the cap layer 314 may deplete the two-dimensional carrier gas 306 of mobile carriers at the gate electrode 312. In some embodiments, the cap layer 314 is doped and/or is a group III-V semiconductor material, a group II-VI semiconductor material, or the like. For example, the cap layer 314 may be or comprise p-doped GaN or some other suitable semiconductor material.

In some embodiments, the channel layer 302 is or comprises GaN, the barrier layer 304 is or comprises AlGaN, the buffer layer 308 is or comprises GaN, the cap layer 314 is or comprise p-doped GaN, and the support substrate 112 is or comprises monocrystalline silicon. Further, in at least some of such embodiments, the first semiconductor substrate 102, the support substrate 112, and the buffer layer 308 define a GaN on silicon substrate.

The second active devices 116 comprise a p-type MOSFET 116p and an n-type MOSFET 116n formed in part by the second semiconductor substrate 104. In alternative embodiments, the second active devices 116 have some other suitable configuration or are some other suitable type of active device. The p-type MOSFET 116p is at an n-type well 316 in the second semiconductor substrate 104, and the n-type MOSFET 116n is at a bulk of the second semiconductor substrate 104. In alternative embodiments, the n-type well 316 is omitted, the p-type MOSFET 116p is at the bulk of the second semiconductor substrate 104, and the n-type MOSFET 116n is at a p-type well in the second semiconductor substrate 104.

The second active devices 116 comprise individual body contact regions 318, individual source/drain regions 320, individual gate electrodes 322, and individual gate dielectric layers 324. Source/drain region(s) may refer to a source or a drain, individually or collectively dependent upon the context. The body contact regions 318 and the source/drain regions 320 correspond to doped regions of the second semiconductor substrate 104. The gate electrodes 322 are sandwiched between corresponding source/drain regions 320 and are separated from the second semiconductor substrate 104 by the gate dielectric layers 324.

The passive devices 118 comprise a metal-insulator-metal (MIM) capacitor 118m, an inductor 118i, and a transformer 118t in the second frontside interconnect structure 120. In alternative embodiments, more or less passive devices and/or different types of passive devices than those illustrated may be in the second frontside interconnect structure 120. The MIM capacitor 118m comprises a first electrode 326, a second electrode 328, and an insulator layer 330 separating the first and second electrodes 326, 328. The inductor 118i is spiral shaped but may have other suitable shapes. The transformer 118t is schematically illustrated and may be formed by conductive features of the second frontside interconnect structure 120.

The first and second frontside interconnect structures 110, 120 define conductive paths 332 electrically coupling the first and second active devices 108, 116 and the passive devices 118 together to form a circuit. For example, a conductive path may electrically couple the MIM capacitor 118m to the first active device 108. As another example, another conductive path may electrically couple the first active device 108 to a source/drain region 320 of the n-type MOSFET 116n. As another example, other conductive paths may electrically couple the first active device 108 to the inductor 118i and the transformer 118t.

Figure 4A:
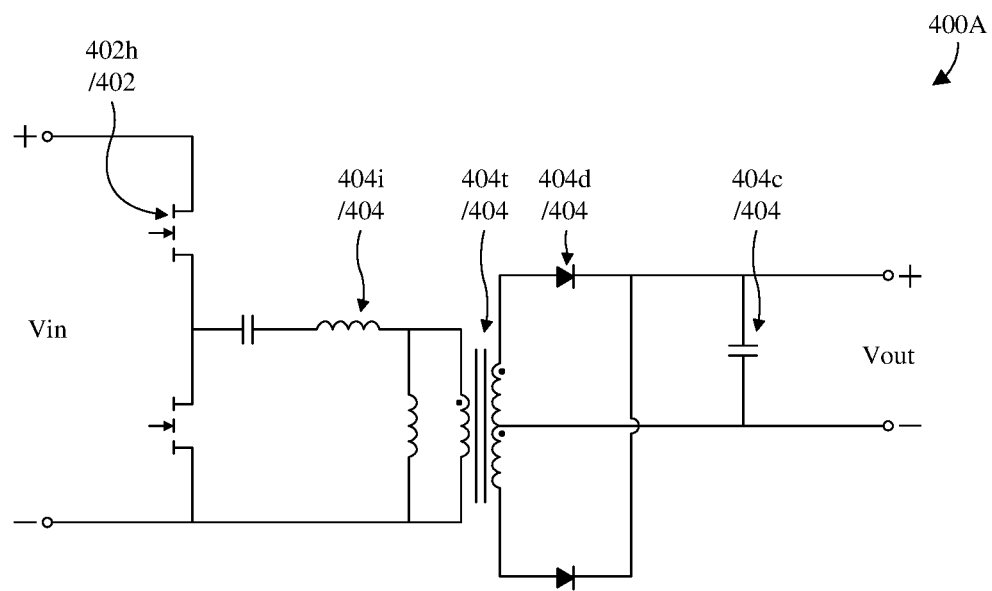
FIGS. 4A and 4B illustrate circuit diagrams respectively of some different embodiments of the 3D IC of FIG. 3.
Figure 4B:
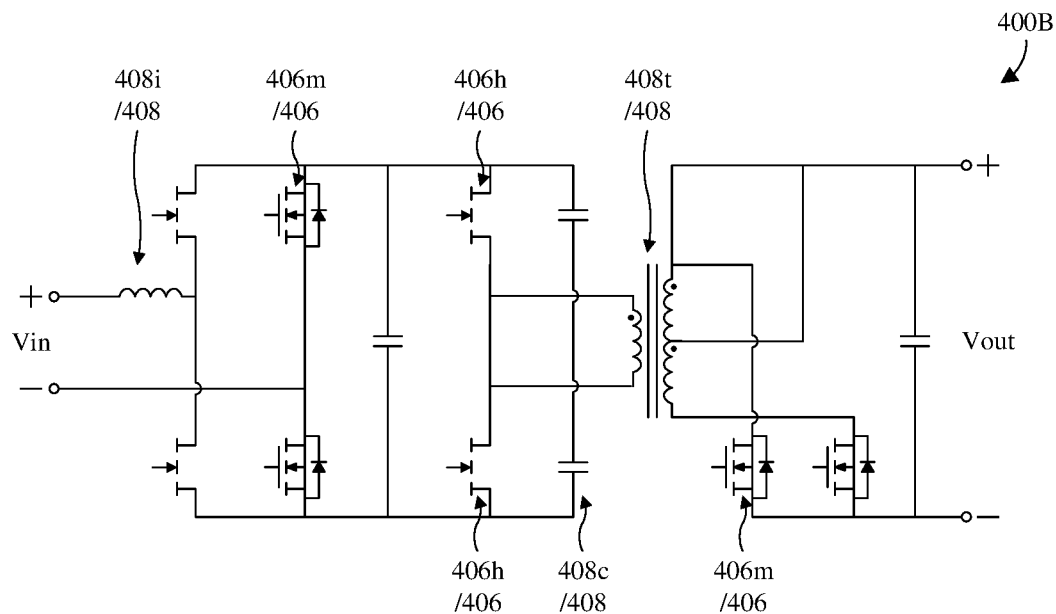

With reference to FIGS. 4A and 4B, circuit diagrams 400A, 400B respectively of some different embodiments of the 3D IC of FIG. 3 are provided.

As illustrated by the circuit diagram 400A of FIG. 4A, the 3D IC is or comprises an LLC power converter. An input voltage Vin is input into the LLC power converter, and an output voltage Vout is output from the LLC power converter. The input voltage Vin may, for example, be about 40-140 volts or some other suitable value, and/or the output voltage Vout may, for example, be about 1-20 volts or some other suitable voltage. In some embodiments, the input voltage Vin is or is about 48 volts and the output voltage Vout is or is about 5 or 12 volts. In some embodiments, the input and output voltages Vin, Vout are directed current (DC).

The LLC power converter comprises a plurality of active devices 402 and a plurality of passive devices 404, which are interconnected by the first and second frontside interconnect structures 110, 120 of FIG. 3. The plurality of active devices 402 include HEMTs 402h, and the plurality of passive devices 404 include capacitors 404c, inductors 404i, a transformer 404t, and diodes 404d. The first active device 108 of FIG. 3 and/or the second active devices 116 of FIG. 3 correspond to the active devices 402. For example, the first active device 108 of FIG. 3 may correspond to one of the HEMTs 402h. The passive devices 118 of FIG. 3 correspond to the passive devices 404. For example, the MIM capacitor 118*m* of FIG. 3 may correspond to one of the capacitors 404*c*, the inductor 118*i* of FIG. 3 may correspond to one of the inductors 404*i*, and the transformer 118*t* of FIG. 3 may correspond to the transformer 404*t*.

As noted above, in some embodiments, the first semiconductor substrate 102 of FIG. 3 has a larger bandgap than the second semiconductor substrate 104 of FIG. 3. In at least some of such embodiments, active devices of the LLC power converter that benefit from the larger bandgap (e.g., the active devices 402) are on and partially formed by the first semiconductor substrate 102. Further, active devices that don't benefit or minimally benefit from the larger bandgap of the first semiconductor substrate 102 are on and partially formed by the second semiconductor substrate 104. At least when the second semiconductor substrate 104 is or comprises monocrystalline silicon, this may reduce cost without compromising performance.

As illustrated by the circuit diagram 400B of FIG. 4B, the 3D IC is or comprises a full-bridge power converter. An input voltage Vin is input into the full-bridge power converter, and an output voltage Vout is output from the full-bridge power converter. The input voltage Vin may, for example, be about 150-300 volts, about 300-650 volts, or some other suitable value, and/or the output voltage Vout may, for example, be about 40-140 volts or some other suitable voltage. In some embodiments, the input voltage Vin is or is about 208 volts and the output voltage Vout is or is about 48 volts. In some embodiments, the input voltage Vin is alternating current (AC), whereas the output voltage Vout is DC.

The full-bridge power converter comprises a plurality of active devices 406 and a plurality of passive devices 408, which are interconnected by the first and second frontside interconnect structures 110, 120 of FIG. 3. The plurality of active devices 406 include HEMTs 406*h* and MOSFETs 406*m*, and the plurality of passive devices 408 include capacitors 408*c*, inductors 408*i*, and a transformer 408*t*. The first and second active devices 108, 116 of FIG. 3 correspond to the active devices 406. For example, the first active device 108 of FIG. 3 may correspond to one of the HEMTs 406*h*, and the second active devices 116 of FIG. 3 may correspond to the MOSFETs 406*m*. The passive devices 118 of FIG. 3 correspond to the passive devices 408. For example, the MIM capacitor 118*m* of FIG. 3 may correspond to one of the capacitors 408*c*, the inductor 118*i* of FIG. 3 may correspond to one of the inductors 408*i*, and the transformer 118*t* of FIG. 3 may correspond to the transformer 408*t*.

As noted above, in some embodiments, the first semiconductor substrate 102 of FIG. 3 has a larger bandgap than the second semiconductor substrate 104 of FIG. 3. In at least some of such embodiments, active devices of the full-bridge power converter that benefit from the larger bandgap (e.g., the HEMTs 406*h*) are on and partially formed by the first semiconductor substrate 102. Further, active devices that don't benefit or minimally benefit from the larger bandgap of the first semiconductor substrate 102 (e.g., the MOSFETs 406*m*) are on and partially formed by the second semiconductor substrate 104. At least when the second semiconductor substrate 104 is or comprises monocrystalline silicon, this may reduce cost without compromising performance.

Figure 5A:
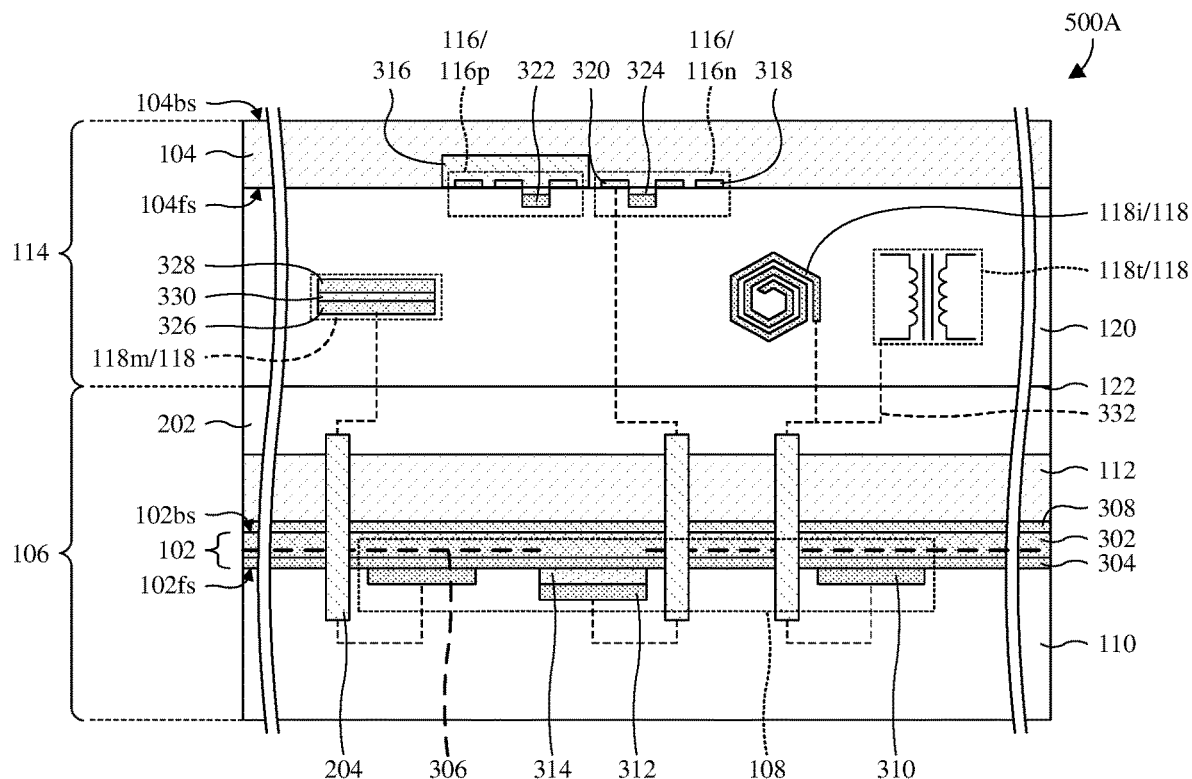
FIGS. 5A-5C illustrate cross-sectional views of some alternative embodiments of the 3D IC of FIG. 3.
Figure 5B:
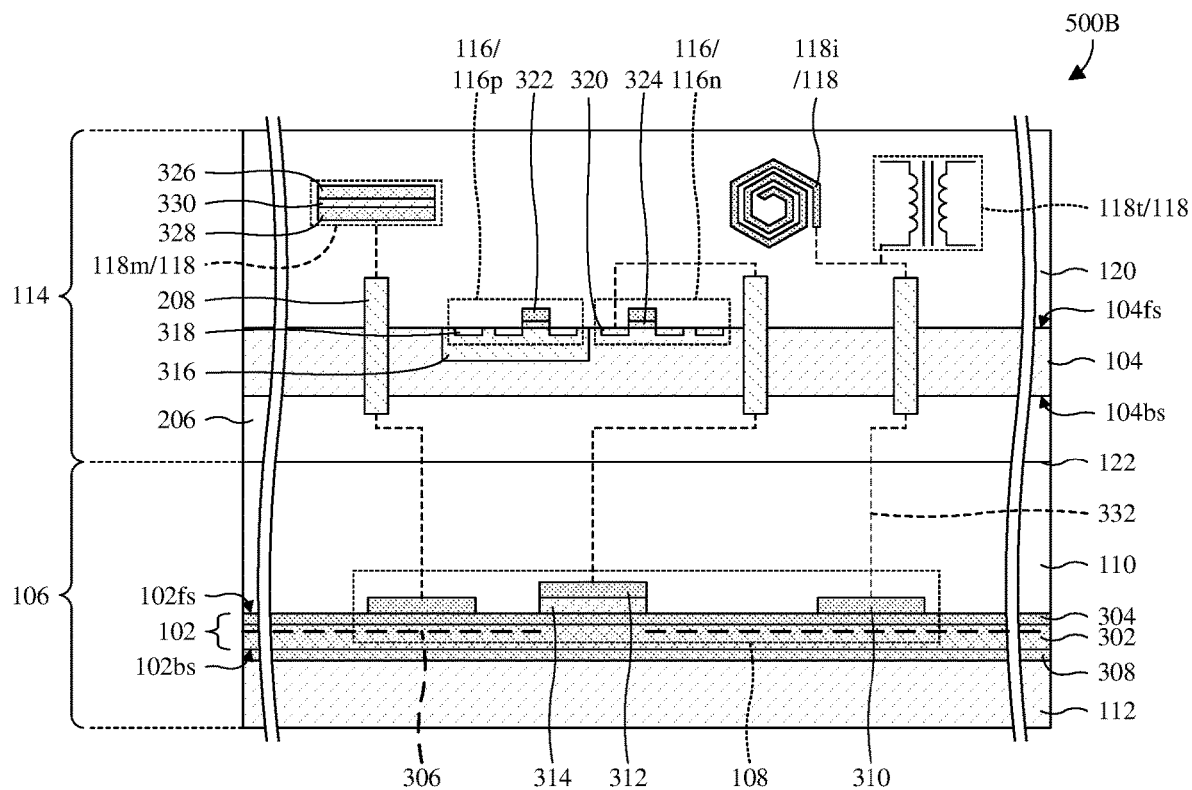
Figure 5C:
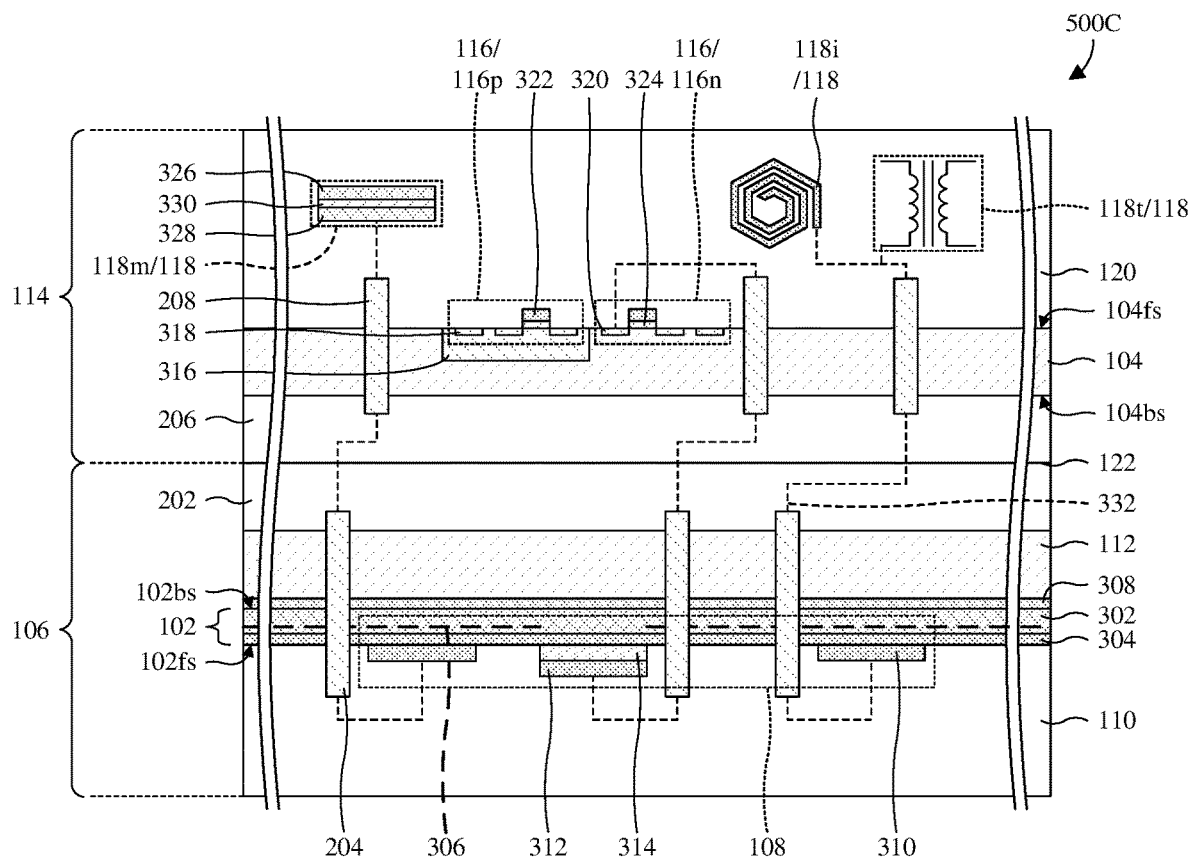

With reference to FIGS. 5A-5C, cross-sectional views 500A-500C of some alternative embodiments of the 3D IC of FIG. 3 are provided.

As illustrated by the cross-sectional view 500A of FIG. 5A, the first and second IC chips 106, 114 are bonded together backside to frontside as described with regard to FIG. 2A. As such, the first IC chip 106 further comprises a backside interconnect structure 202 and TSVs 204, which contribute to the conductive paths 332.

As illustrated by the cross-sectional view 500B of FIG. 5B, the first and second IC chips 106, 114 are bonded together frontside to backside as described with regard to FIG. 2B. As such, the second IC chip 114 further comprises a backside interconnect structure 206 and TSVs 208, which contribute to the conductive paths 332.

As illustrated by the cross-sectional view 500C of FIG. 5C, the first and second IC chips 106, 114 are bonded together backside to backside as described with regard to FIG. 2C. As such, the first IC chip 106 is as in FIG. 5A, and the second IC chip 114 is as in FIG. 5B, except that the conductive paths 332 are different at the backside interconnect structure 202 of the first IC chip 106 and the backside interconnect structure 206 of the second IC chip 114.

Figure 6:
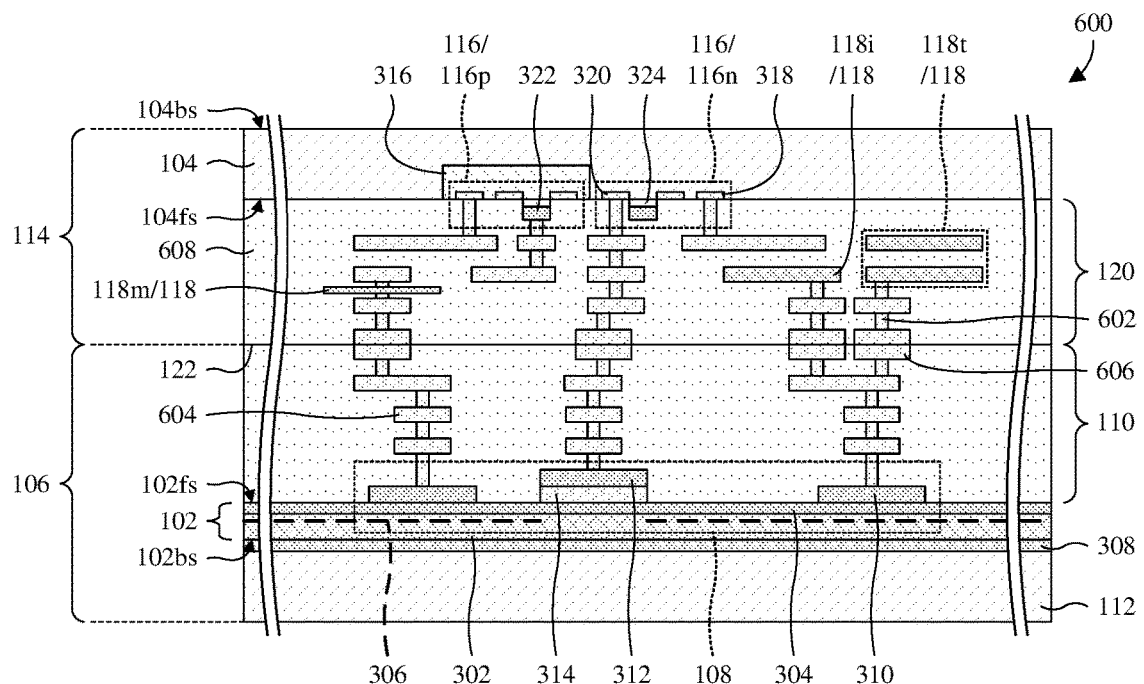
FIG. 6 illustrates a cross-sectional view of some more detailed embodiments of the 3D IC of FIG. 3 in which interconnect structures of the 3D IC have additional detail.

With reference to FIG. 6, a cross-sectional view 600 of some more detailed embodiments of the 3D IC of FIG. 3 is provided in which the first and second frontside interconnect structures 110, 120 have additional detail. In particular, the first and second frontside interconnect structures 110, 120 comprise a plurality of vias 602, a plurality of wires 604, and a plurality of pads 606 stacked in corresponding interconnect dielectric layers 608 to define conductive paths (e.g., the conductive paths 332 of FIG. 3).

The pads 606 are grouped in a plurality of pad layers individual to the first and second frontside interconnect structures 110, 120, and the pad layers directly contact at the bond interface 122. The vias 602 and the wires 604 are grouped in a plurality of via layers and a plurality of wire layers. Via layers and wire layers at the first frontside interconnect structure 110 are alternatingly stacked from the pad layer of the first frontside interconnect structure 110 to the first active device 108. Similarly, via layers and wire layers at the second frontside interconnect structure 120 are alternatingly stacked from the pad layer of the second frontside interconnect structure 120 to the second active devices 116. The vias 602, the wires 604, and the pads 606 are conductive and may, for example, be or comprise copper, aluminum, aluminum copper, the like, or any combination of the foregoing.

Figure 7A:
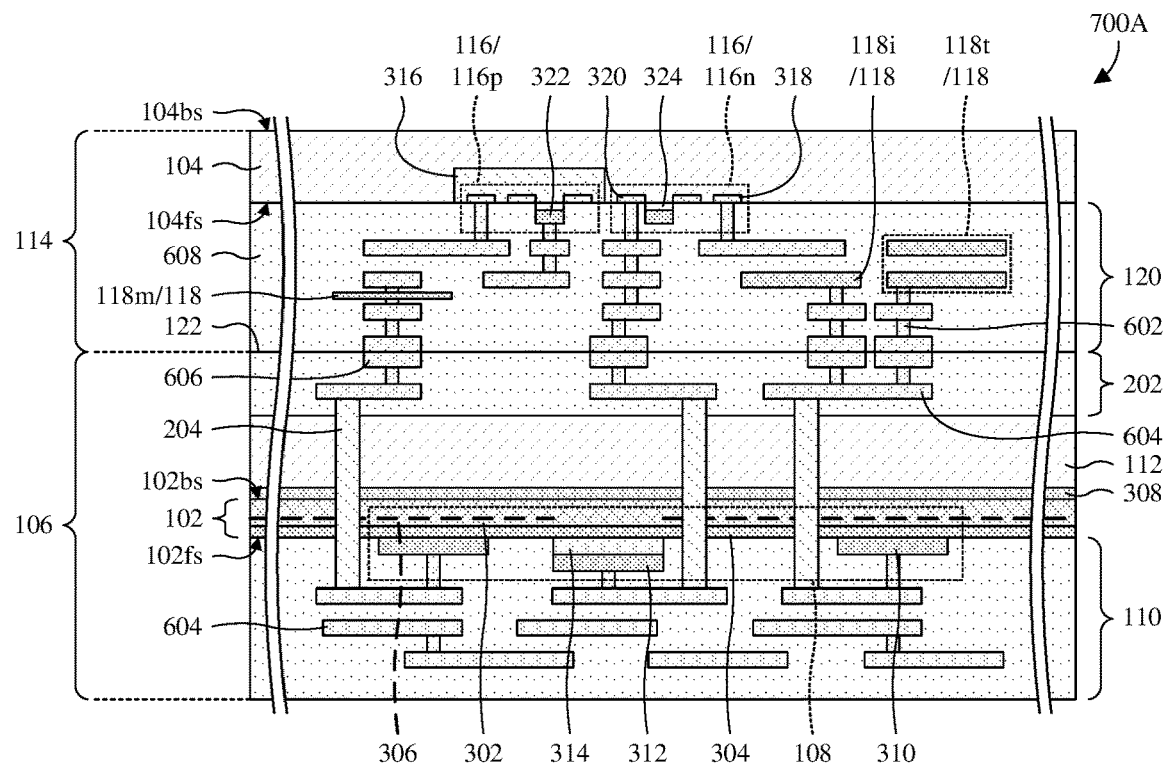
FIGS. 7A-7C illustrate cross-sectional views of some alternative embodiments of the 3D IC of FIG. 6.
Figure 7B:
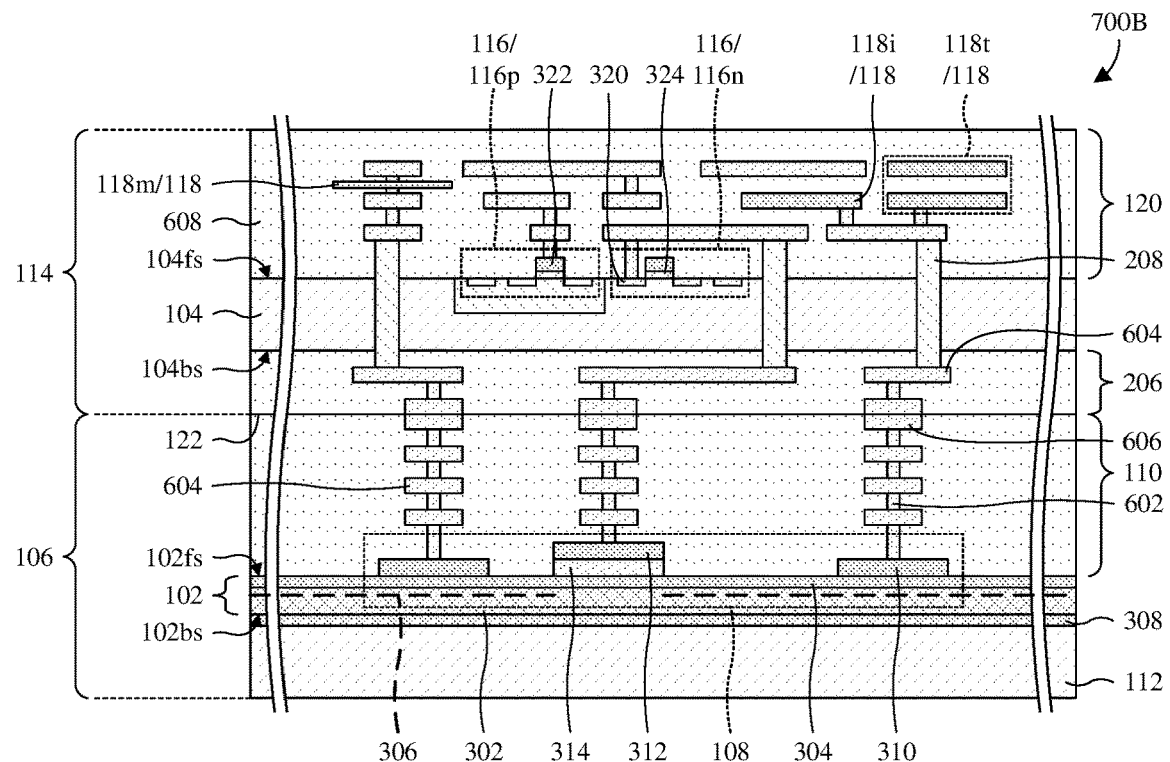
Figure 7C:
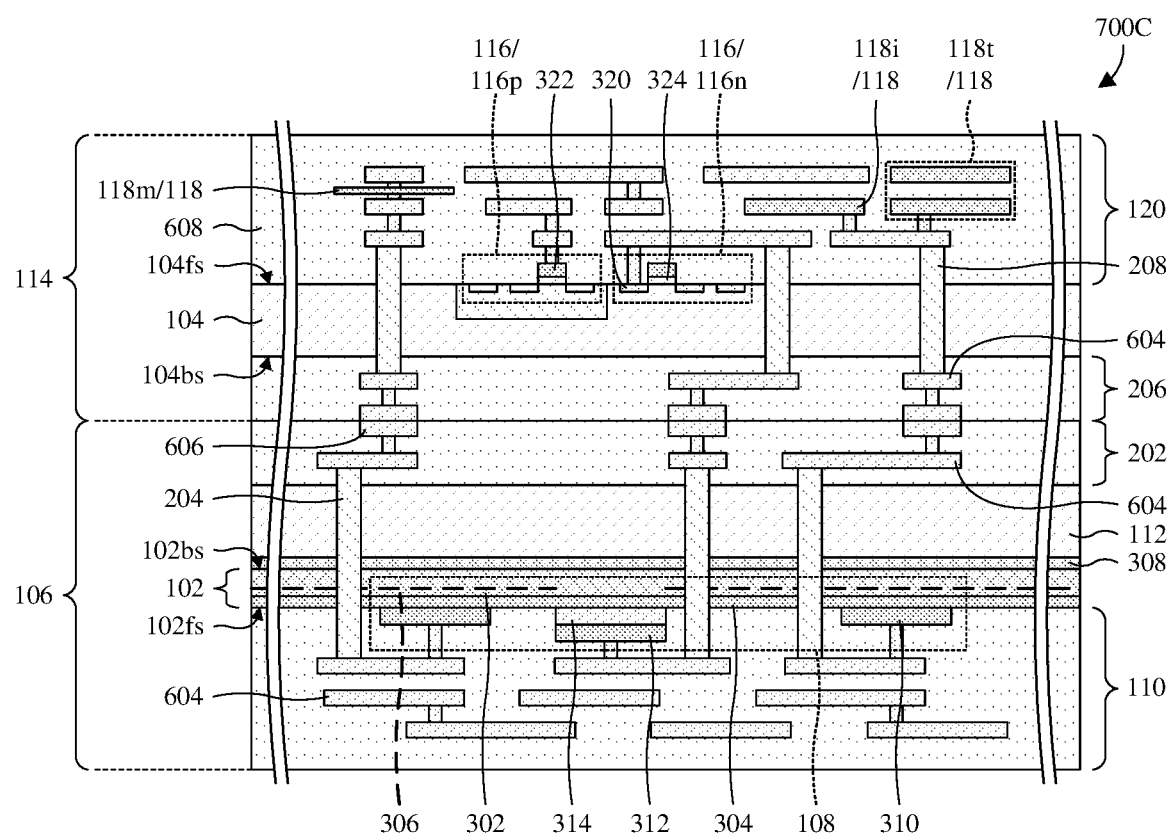

With reference to FIGS. 7A-7C, cross-sectional views 700A-700C of some alternative embodiments of the 3D IC of FIG. 6 are provided.

As illustrated by the cross-sectional view 700A of FIG. 7A, the first and second IC chips 106, 114 are bonded together backside to frontside as described with regard to FIG. 2A and/or FIG. 5A. As such, the first IC chip 106 further comprises a backside interconnect structure 202 and TSVs 204. Note that the TSVs 204 may be separated from the first semiconductor substrate 102 and the support substrate 112 by corresponding TSV dielectric layers (not shown) in some embodiments.

As illustrated by the cross-sectional view 700B of FIG. 7B, the first and second IC chips 106, 114 are bonded together frontside to backside as described with regard to FIG. 2B and/or FIG. 5B. As such, the second IC chip 114 further comprises a backside interconnect structure 206 and TSVs 208. Note that the TSVs 208 may be separated from the second semiconductor substrate 104 by corresponding TSV dielectric layers (not shown) in some embodiments.

The backside interconnect structure 202 of FIG. 7A and the backside interconnect structure 206 of FIG. 7B are as of the first and second frontside interconnect structures 110, 120 are described, whereby the backside interconnect structures 202, 206 comprise a plurality of vias 602, a plurality of wires 604, and a plurality of pads 606 stacked in a corresponding interconnect dielectric layer 608. Further, note that the wires 604 of the backside interconnect structures 202, 206 may also be known as RDLs or the like.

As illustrated by the cross-sectional view 700C of FIG. 7C, the first and second IC chips 106, 114 are bonded together backside to backside as described with regard to FIG. 2C and/or FIG. 5C. As such, the first IC chip 106 is as in FIG. 7A, and the second IC chip 114 is as in FIG. 7B, except that the conductive paths are different at the backside interconnect structures 202, 206 of the first and second IC chips 106, 114.

Figure 8:
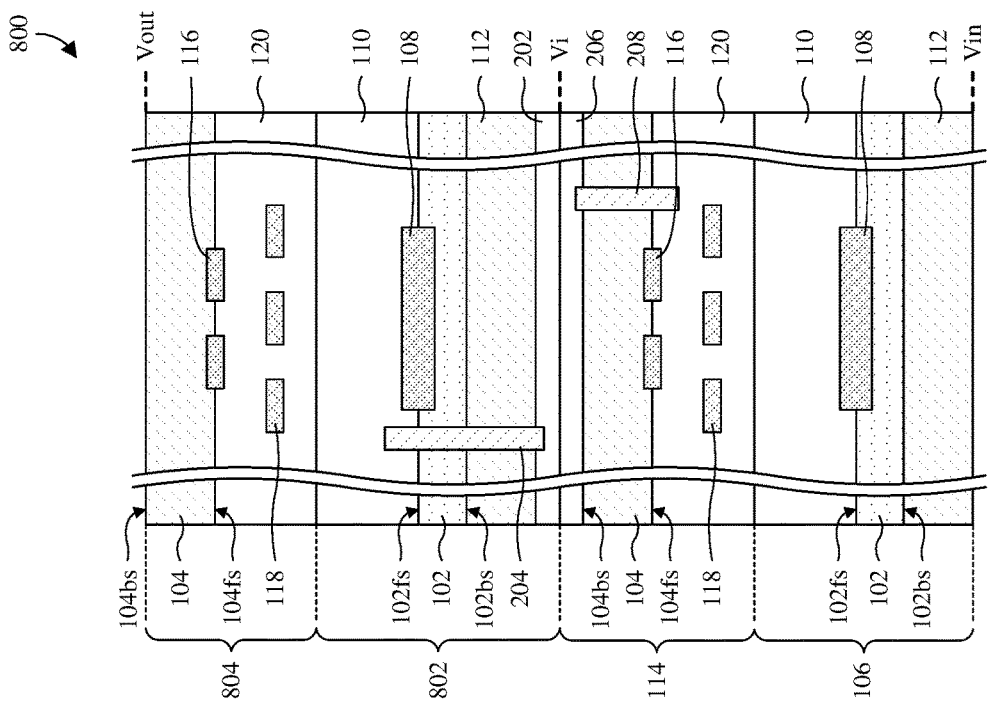
FIG. 8 illustrates a cross-sectional view of some alternative embodiments of the 3D IC of FIG. 1 in which the 3D IC comprises additional IC chips.

With reference to FIG. 8, a cross-sectional view 800 of some alternative embodiments of the 3D IC of FIG. 1 is provided in which the 3D IC comprises additional IC chips. In particular, the 3D IC further comprises a third IC chip 802 and a fourth IC chip 804 stacked over the first and second IC chips 106, 114.

The first and second IC chips 106, 114 are as described with regard to FIG. 1, except that the second IC chip 114 further comprises the backside interconnect structure 206 and the TSV 208 described with regard to FIG. 2B. Further, the third and fourth IC chips 802, 804 are respectively as the first and second IC chips 106, 114 are described with regard to FIG. 1, except that the third IC chip 802 further comprises the backside interconnect structure 202 and the TSV 204 described with regard to FIG. 2A. Because the third and fourth IC chips 802, 804 are as the first and second IC chips 106, 114 are described with regard to FIG. 1, constituents of the third IC chip 802 use the same reference numbers as the first IC chip 106, and constituents of the fourth IC chip 804 use the same reference numbers as the second IC chip 114.

The first and second IC chips 106, 114 are bonded together frontside to frontside, the third and fourth IC chips 802, 804 are bonded together frontside to frontside, and the second and third IC chips 114, 802 are bonded together backside to backside. Further, the backside interconnect structures 202, 206 and the TSVs 204, 208 provide electrical coupling between the frontside interconnect structures 120, 110 of the second and third IC chips 114, 802.

In some embodiments, the 3D IC is or comprises a full-bridge converter and an LLC power converter. In at least some of such embodiments, the first and second IC chips 106, 114 substantially or wholly define the full-bridge power converter, and the third and fourth IC chips 802, 804 substantially or wholly define the LLC power converter electrically coupled in series with the full-bridge power converter. For example, an output of the full-bridge power converter is electrically coupled to an input of the LLC power converter. The full-bridge power converter may, for example, be as described with regard to FIGS. 3 and 4B, whereas the LLC power converter may, for example, be as described with regard to FIGS. 3 and 4A.

As schematically illustrated, an input voltage Vin is provided to full-bridge power converter at the first IC chip 106, and the full-bridge power converter reduces the input voltage to an intermediate voltage Vi less than the input voltage Vin at a bond interface between the second and third IC chips 114, 802. The LLC power converter then reduces the intermediate voltage Vi to an output voltage Vout less than the intermediate voltage Vi at the fourth IC chip 804. The input voltage Vin may, for example, be about 150-300 volts, about 300-650 volts, or some other suitable value, the intermediate voltage Vi may, for example, be about 40-140 volts or some other suitable voltage, and/or the output voltage Vout may, for example, be about 1-20 volts or some other suitable voltage. In some embodiments, the input voltage Vin is or is about 208 volts, the intermediate voltage Vi is or is about 48 volts, and the output voltage Vout is or is about 5 or 12 volts. In some embodiments, the input voltage Vin is AC, whereas the intermediate voltage Vi and the output voltage Vout are DC.

In some embodiments, the semiconductor substrates 102 of the first and third IC chips 106, 802 have a wider bandgap than the semiconductor substrates 104 of the second and fourth IC chips 114, 804. For example, the semiconductor substrates 102 of the first and third IC chips 106, 802 may be or comprise GaN or the like, whereas the semiconductor substrates 104 of the second and fourth IC chips 114, 804 may be or comprise monocrystalline silicon or the like. Further, in at least some of such embodiments, active devices that benefit from the wider bandgap are formed on the semiconductor substrates 102 of the first and third IC chips 106, 802, whereas active devices that don't benefit or minimally benefit from the wider bandgap are formed on the semiconductor substrates 104 of the second and fourth IC chips 114, 804. In embodiments in which the semiconductor substrates 104 of the second and fourth IC chips 114, 804 are or comprise silicon, this may lead to reduced costs without compromising performance since silicon is generally cheaper to work with than other semiconductor materials.

With reference to FIGS. 9A-9H, cross-sectional views 900A-900H of some alternative embodiments of the 3D IC of FIG. 8 are provided in which orientations of the first, second, third, and fourth IC chips 106, 114, 802, 804 are varied.

Figure 9A:
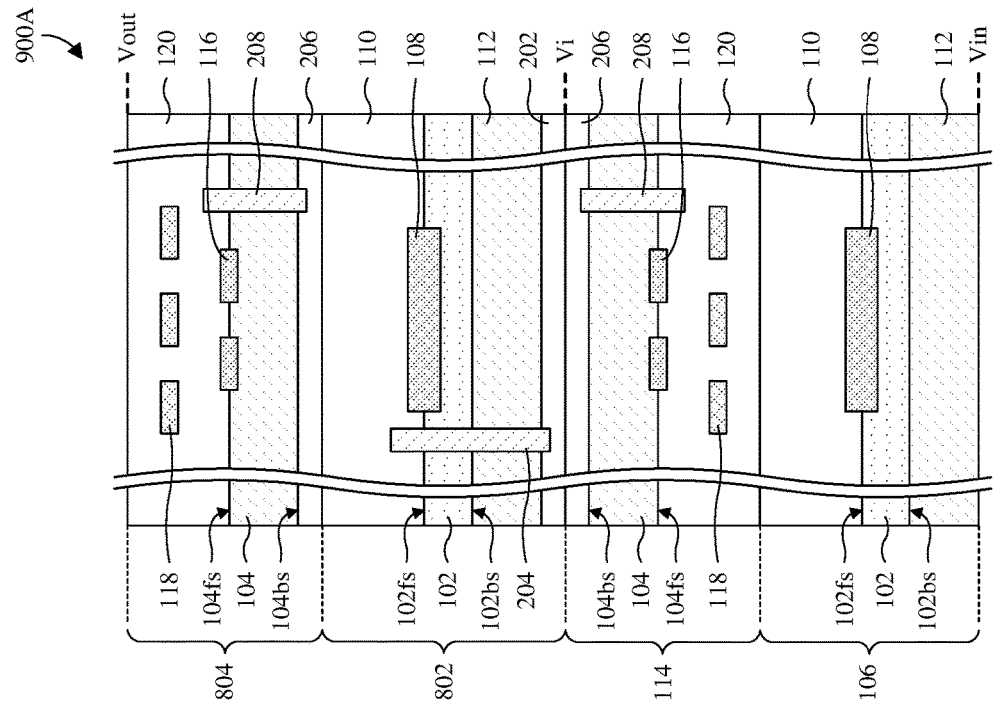

As illustrated by the cross-sectional view 900A of FIG. 9A, the fourth IC chip 804 is vertically flipped relative to FIG. 8. As a result, the third and fourth IC chips 802, 804 are bonded together frontside to backside. Further, the fourth IC chip 804 further comprises a backside interconnect structure 206 and a TSV 208 as described with regard to FIG. 2B.

Figure 9C:
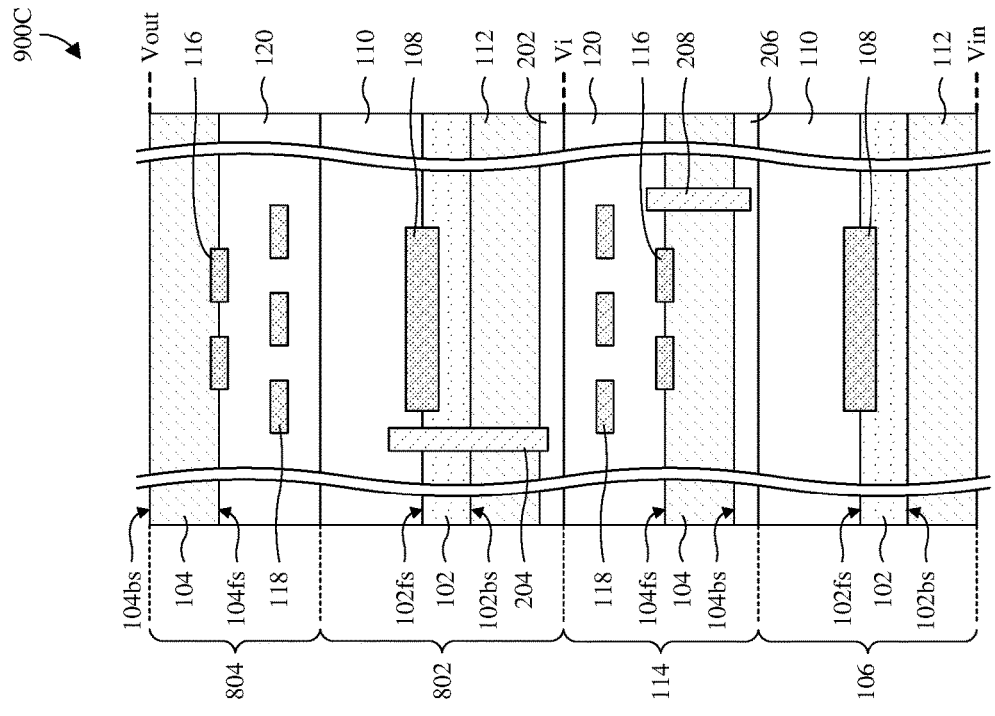
Figure 9B:
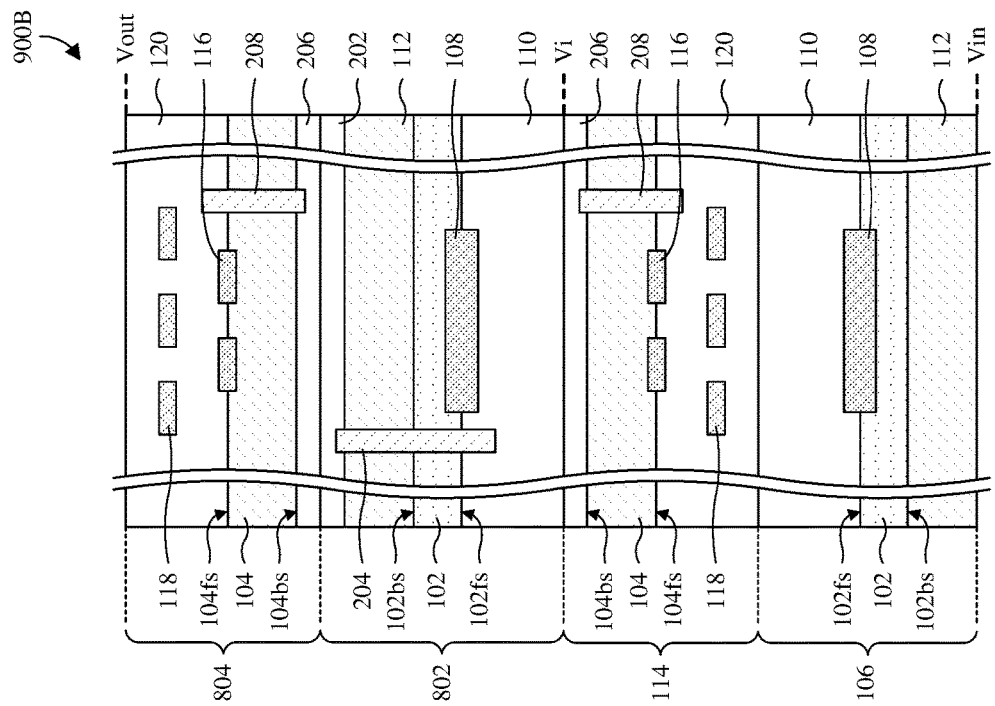

As illustrated by the cross-sectional view 900B of FIG. 9B, the third and fourth IC chips 802, 804 are each vertically flipped relative to FIG. 8. As a result, the third and fourth IC chips 802, 804 are bonded together backside to backside, and the second and third IC chips 114, 802 are bonded together backside to frontside. Further, the fourth IC chip 804 further comprises a backside interconnect structure 206 and a TSV 208 as described with regard to FIG. 2B.

As illustrated by the cross-sectional view 900C of FIG. 9C, the second IC chip 114 is vertically flipped relative to FIG. 8. As a result, the first and second IC chips 106, 114 are bonded together frontside to backside. Further, the second and third IC chips 114, 802 are bonded together frontside to backside.

Figure 9E:
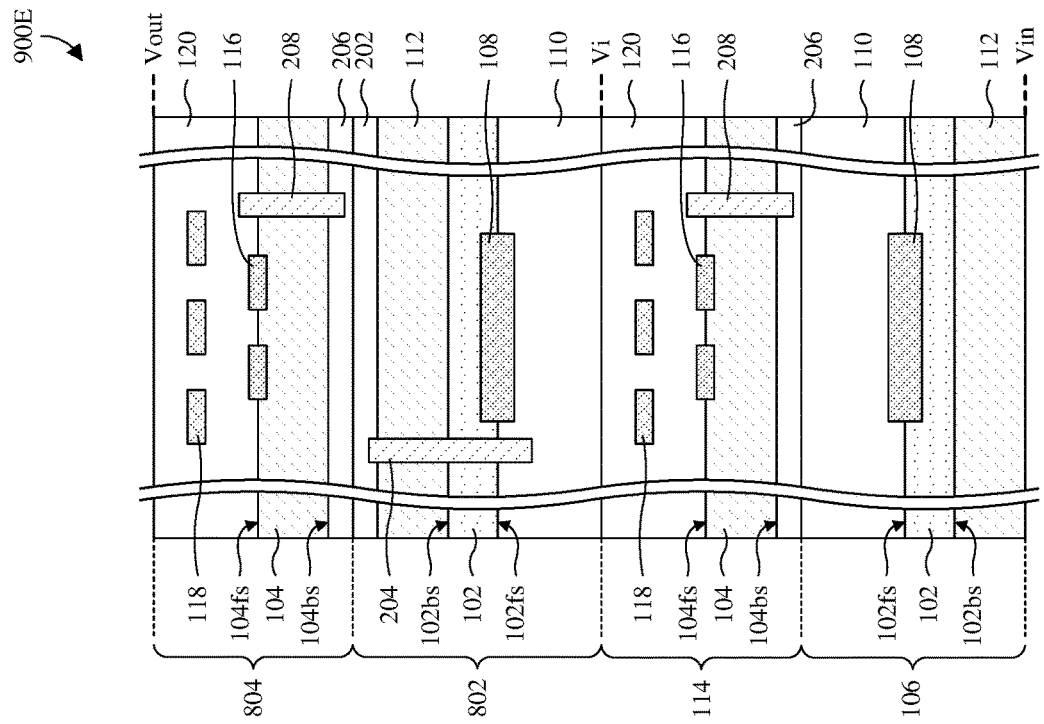
Figure 9D:
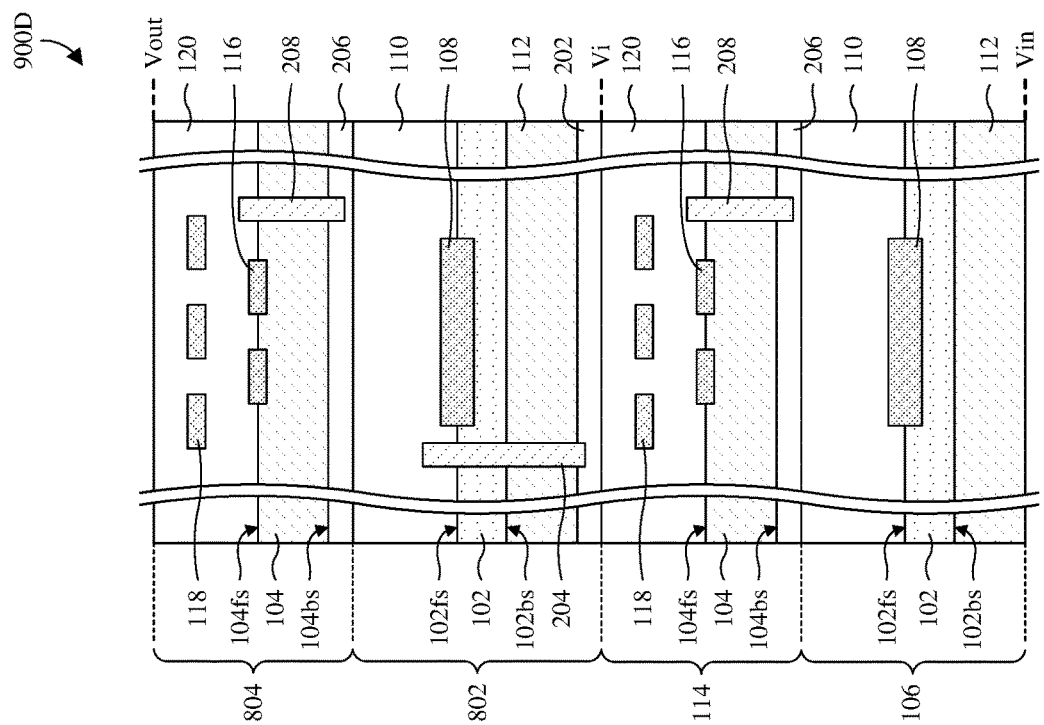

As illustrated by the cross-sectional view 900D of FIG. 9D, the second IC chip 114 and the fourth IC chip 804 are each vertically flipped relative to FIG. 8. As a result, the first and second IC chips 106, 114 are bonded together frontside to backside, the second and third IC chips 114, 802 are bonded together frontside to backside, and the third and fourth IC chips 802, 804 are bonded together frontside to backside. Further, the fourth IC chip 804 further comprises a backside interconnect structure 206 and a TSV 208 as described with regard to FIG. 2B.

As illustrated by the cross-sectional view 900E of FIG. 9E, the second IC chip 114, the third IC chip 802, and the fourth IC chip 804 are each vertically flipped relative to FIG. 8. As a result, the first and second IC chips 106, 114 are bonded together frontside to backside, the second and third IC chips 114, 802 are bonded together frontside to frontside, the second and third IC chips 114, 802 are bonded together frontside to frontside, and the third and fourth IC chips 802, 804 are bonded together backside to backside. Further, the fourth IC chip 804 further comprises a backside interconnect structure 206 and a TSV 208 as described with regard to FIG. 2B.

As illustrated by the cross-sectional view 900F of FIG. 9F, the first IC chip 106 and the second IC chip 114 are each vertically flipped relative to FIG. 8. As a result, the first and second IC chips 106, 114 are bonded together backside to backside, and the second and third IC chips 114, 802 are bonded together frontside to backside. Further, the first IC chip 106 further comprises a backside interconnect structure 202 and a TSV 204 as described with regard to FIG. 2A.

As illustrated by the cross-sectional view 900G of FIG. 9G, the first IC chip 106, the second IC chip 114, and the fourth IC chip 804 are each vertically flipped relative to FIG. 8. As a result, the first and second IC chips 106, 114 are bonded together backside to backside, the second and third IC chips 114, 802 are bonded together frontside to backside, and the third and fourth IC chips 802, 804 are bonded together frontside to backside. Further, the fourth IC chip 804 further comprises a backside interconnect structure 206 and a TSV 208 as described with regard to FIG. 2B, and the first IC chip 106 further comprises a backside interconnect structure 202 and a TSV 204 as described with regard to FIG. 2A.

Figure 9H:
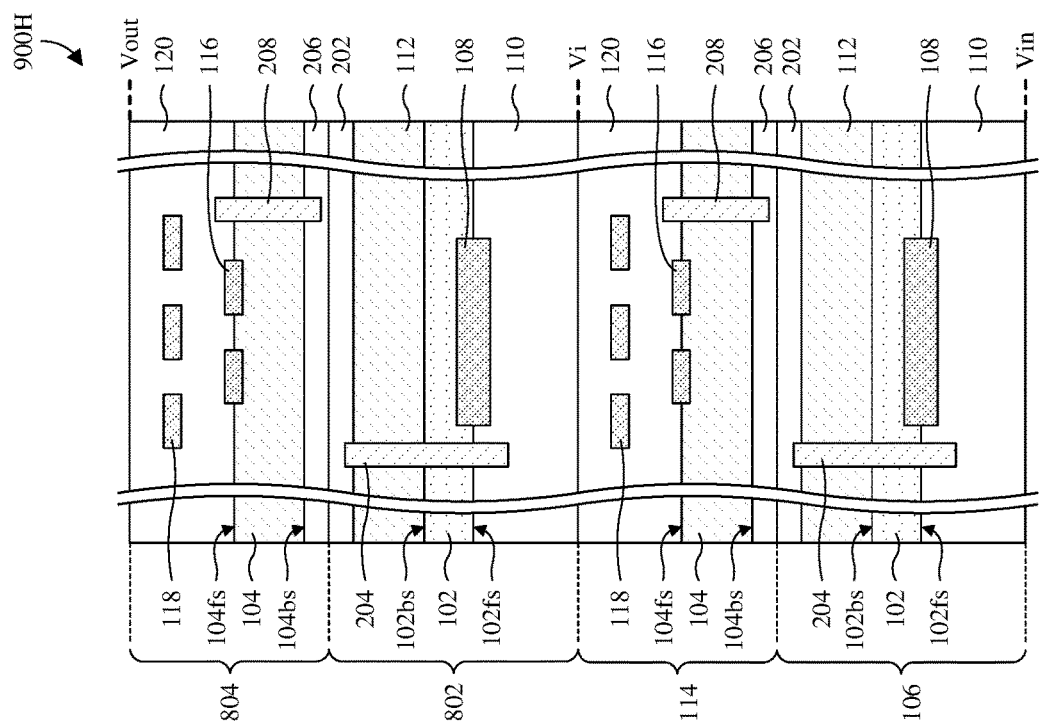

As illustrated by the cross-sectional view 900H of FIG. 9H, the first IC chip 106, the second IC chip 114, the third IC chip 802, and the fourth IC chip 804 are each vertically flipped relative to FIG. 8. As a result, the first and second IC chips 106, 114 are bonded together backside to backside, the second and third IC chips 114, 802 are bonded together frontside to frontside, and the third and fourth IC chips 802, 804 are bonded together backside to backside. Further, the fourth IC chip 804 further comprises a backside interconnect structure 206 and a TSV 208 as described with regard to FIG. 2B, and the first IC chip 106 further comprises a backside interconnect structure 202 and a TSV 204 as described with regard to FIG. 2A.

Figure 10:
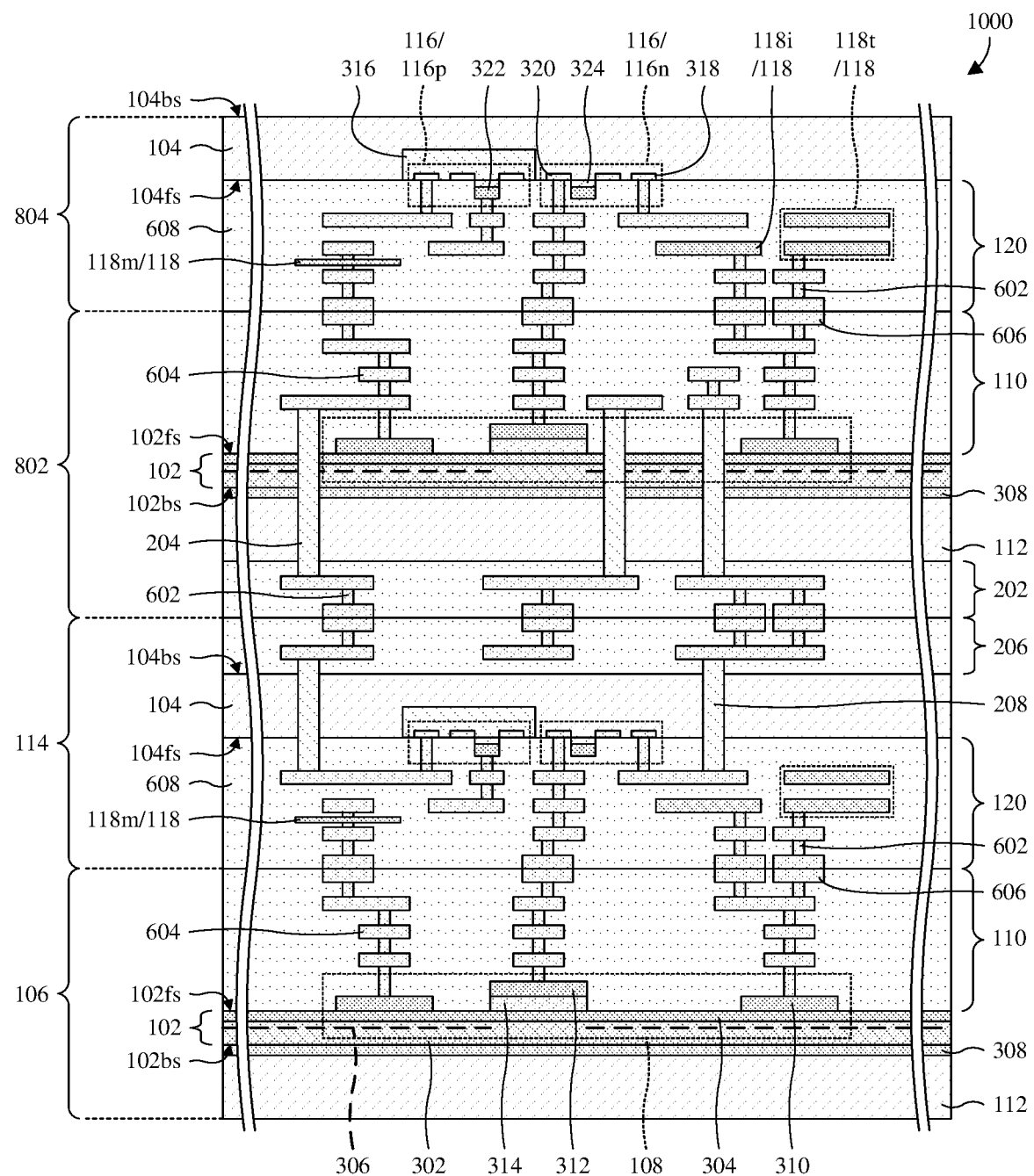
FIG. 10 illustrates a cross-sectional view of some embodiments of the 3D IC of FIG. 8 in which the 3D IC has additional detail.

With reference to FIG. 10, a cross-sectional view 1000 of some embodiments of the 3D IC of FIG. 8 is provided in which the 3D IC has additional detail. The first IC chip 106 is as described with regard to FIG. 6, and the third IC chip 802 is as the first IC chip 106 is described with regard to FIG. 7A. The second IC chip 114 is as described with regard to FIG. 7B, and the fourth IC chip 804 is as the second IC chip 114 is described with regard to FIG. 6.

As above, in some embodiments, the 3D IC is or comprises a full-bridge converter and an LLC power converter electrically coupled in series. The first and second IC chips 106, 114 substantially or wholly define the full-bridge power converter, and the third and fourth IC chips 802, 804 substantially or wholly define the LLC power converter electrically coupled in series with the full-bridge power converter. The full-bridge power converter may, for example, be as described with regard to FIGS. 3 and 4B, whereas the LLC power converter may, for example, be as described with regard to FIGS. 3 and 4A.

Figure 11:
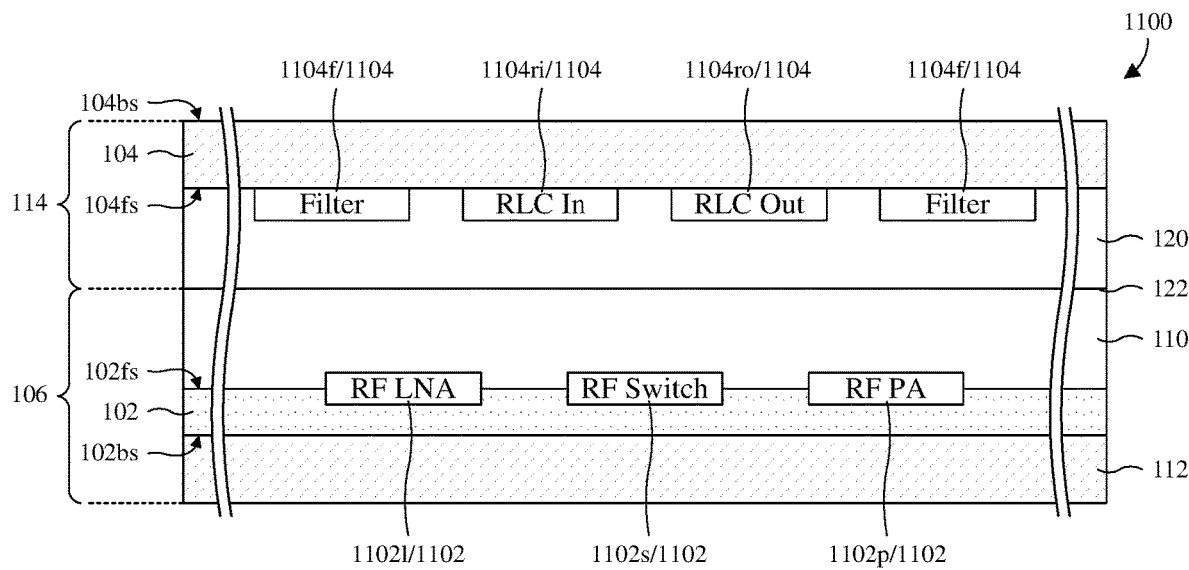
FIG. 11 illustrates a cross-sectional view of some embodiments of the 3D IC of FIG. 1 in which devices of the 3D IC correspond to radio frequency (RF).

With reference to FIG. 11, a cross-sectional view 1100 of some alternative embodiments of the 3D IC of FIG. 1 is provided in which the 3D IC is applied to RF. A plurality of first RF devices 1102 is on and partially formed by the first semiconductor substrate 102, whereas a plurality of second RF devices 1104 is on the second semiconductor substrate 104. Because the first RF devices 1102 are partially formed by the first semiconductor substrate 102, the first RF devices 1102 may also be referred to as first RF semiconductor devices. In some embodiments, one, some, or all of the second RF devices 1104 is/are partially formed by the second semiconductor substrate 104, whereby these one or more RF devices may also be referred to as second RF semiconductor device(s). In some embodiments, the first RF devices 1102 are active RF devices, whereas one, some, or all of the second RF devices 1104 is/are passive RF devices. In some embodiments, the first RF devices 1102 are semiconductor devices, and/or one, some, or all of the second RF devices 1104 is/are semiconductor devices.

The first and second RF devices 1104 may, for example, be interconnected by the first and second frontside interconnect structures 110, 120 to define a FEM, a transceiver, an MMIC, or some other suitable RF circuit. The first RF devices 1102 may, for example, include a low noise amplifier (LNA) 1102$l$, an RF switch 1102$s$, and a power amplifier (PA) 1102$p$. The second RF devices 1104 may, for example, include a plurality of filters 1104$f$, a resistor-inductor-capacitor (RLC) input matching network 1104$ri$, and an RLC output matching network 1104$ro$. Additional and/or alternative RF devices are, however, amenable.

In some embodiments, the first semiconductor substrate 102 has a larger bandgap than the second semiconductor substrate 104. For example, the first semiconductor substrate 102 may be or comprise GaN or the like, whereas the second semiconductor substrate 104 may be or comprise monocrystalline silicon or the like. The larger bandgap leads to smaller RC parasitic elements, which allows active RF devices on and partially formed by the first semiconductor substrate 102 to operate at high frequencies. Therefore, to the extent that the first semiconductor substrate 102 has the larger bandgap, active RF devices that benefit from the larger bandgap (e.g., the first RF devices 1102) may be formed on and partially formed by the first semiconductor substrate 102. On the other hand, RF devices that don't benefit or minimally benefit from the larger bandgap of the first semiconductor substrate 102 (e.g., the second RF devices 1104) may be formed on the second semiconductor substrate 104. This may reduce costs with little to no performance tradeoff because forming RF devices on non-silicon substrates tends to be more costly than forming RF devices on silicon substrates.

Figure 12:
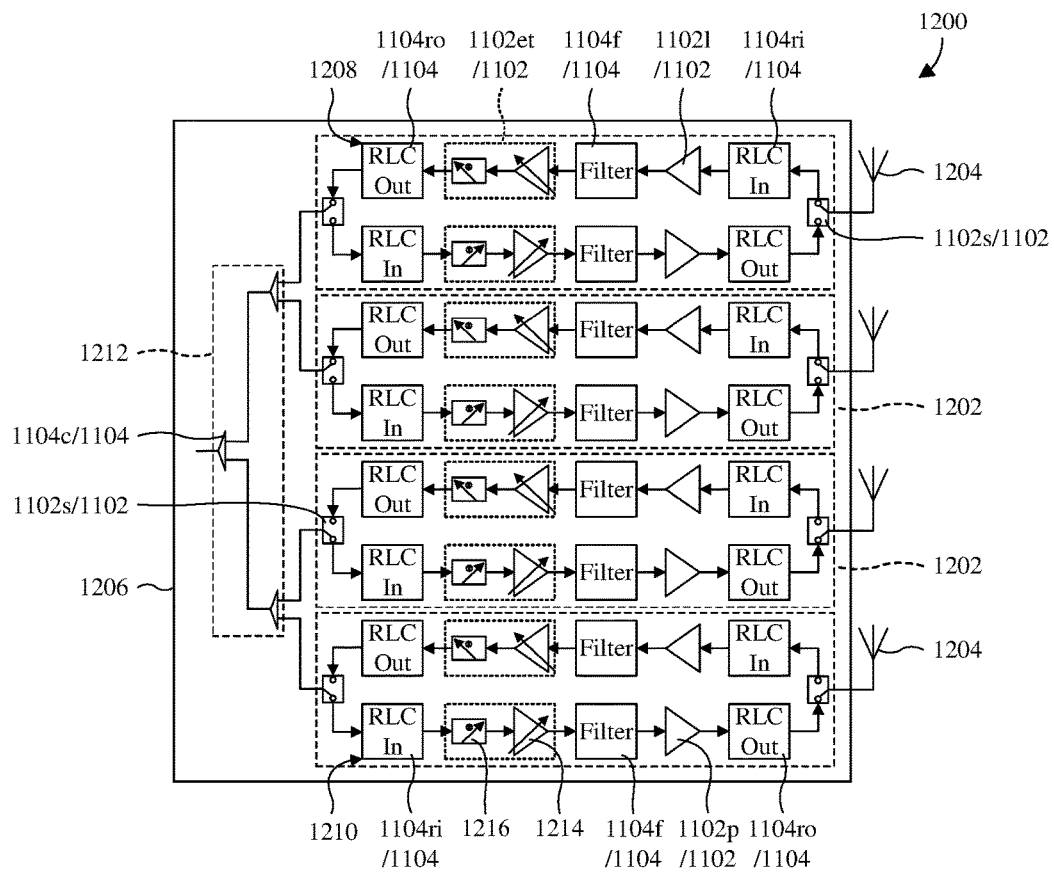
FIG. 12 illustrates a circuit diagram of some embodiments of the 3D IC of FIG. 11.

With reference to FIG. 12, a circuit diagram 1200 of some embodiments of the 3D IC of FIG. 11 is provided in which the 3D IC comprises a plurality of receive-transmit (Rx/Tx) chain pairs 1202. The Rx/Tx chain pairs 1202 are configured to couple to individual antennas 1204, which are external to the 3D IC. For clarity, bounds of the 3D IC are schematically represented by a box 1206 separating the Rx/Tx chain pairs 1202 from the antennas 1204.

Each of the Rx/Tx chain pairs 1202 comprises a receive chain 1208, a transmit chain 1210, and a pair of RF switches 1102$s$. Further, each of the Rx/Tx chain pairs 1202 is configured to operate in a transmit mode and a receive mode. For each of the Rx/Tx chain pairs 1202, the receive chain 1208 of that Rx/Tx chain pair and the transmit chain 1210 of that Rx/Tx chain pair are electrically coupled between the RF switches 1102$s$ of that Rx/Tx chain pair. In the receive mode of that Rx/Tx chain pair, the RF switches 1102$s$ of that Rx/Tx chain pair electrically couple the receive chain 1208 of that Rx/Tx chain pair to input/output ports of that Rx/Tx chain pair. In the transmit mode of that Rx/Tx chain pair, the RF switches 1102$s$ of that Rx/Tx chain pair electrically couple the transmit chain 1210 of that Rx/Tx chain pair to the input/output ports of that Rx/Tx chain pair. The individual antenna 1204 of that Rx/Tx chain pair is electrically coupled to one of the input/output ports of that Rx/Tx chain pair, and an RF combiner/splitter circuit 1212 shared by the Rx/Tx chain pairs 1202 is electrically coupled to another one of the input/output ports of that Rx/Tx chain pair.

The receive and transmit chains 1208, 1210 of the Rx/Tx chain pairs 1202 comprise corresponding filters 1104*f*, corresponding RLC input matching network 1104*ri*, corresponding RLC output matching network 1104*ro*, and corresponding envelope trackers 1102*et*. Further, the receive chains 1208 comprise corresponding LNAs 11021, whereas the transmit chains 1210 comprise corresponding PAs 1102*p*. The envelope trackers 1102*et* are included amongst the first RF devices 1102 of FIG. 11 and hence are on and partially formed by the first semiconductor substrate 102 of FIG. 11. The envelope trackers 1102*et* comprise corresponding variable amplifiers 1214 and corresponding variable phase shifters 1216.

The RF combiner/splitter circuit 1212 comprises a plurality of RF combiners/splitters 1104*c*. The RF combiners/splitters 1104*c* are configured to split a transmit signal to be transmit with the Rx/Tx chain pairs 1202, and are further configured to combine signals received with the Rx/Tx chain pairs 1202 into a single receive signal. The RF combiners/splitters 1104*c* are included amongst the second RF devices 1104 of FIG. 11 and hence are on and partially formed by the second semiconductor substrate 104 of FIG. 11. In alternative embodiments, of RF combiners/splitters 1104*c* have some other suitable configuration. Further, in alternative embodiments, the RF combiner/splitter circuit 1212 additionally or alternatively comprises RF dividers, RF transmission lines, the like, or any combination of the foregoing.

Figure 13A:
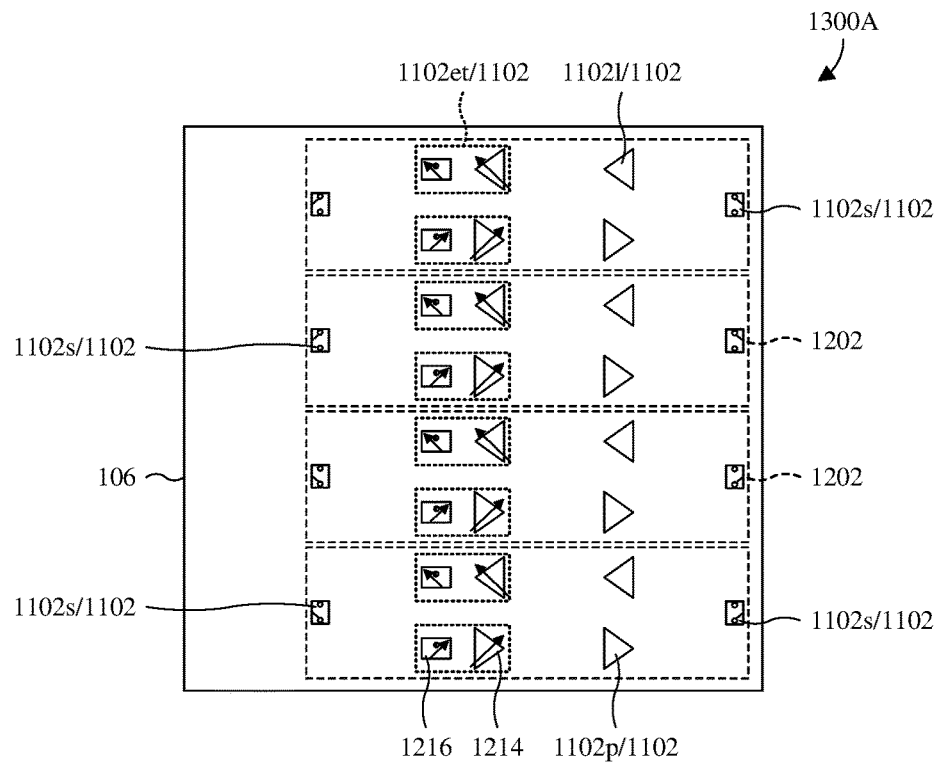
FIGS. 13A and 13B illustrate some embodiments respectively of IC chips of the 3D IC of FIGS. 11 and 12 in which components of the 3D IC are split amongst the IC chips.
Figure 13B:
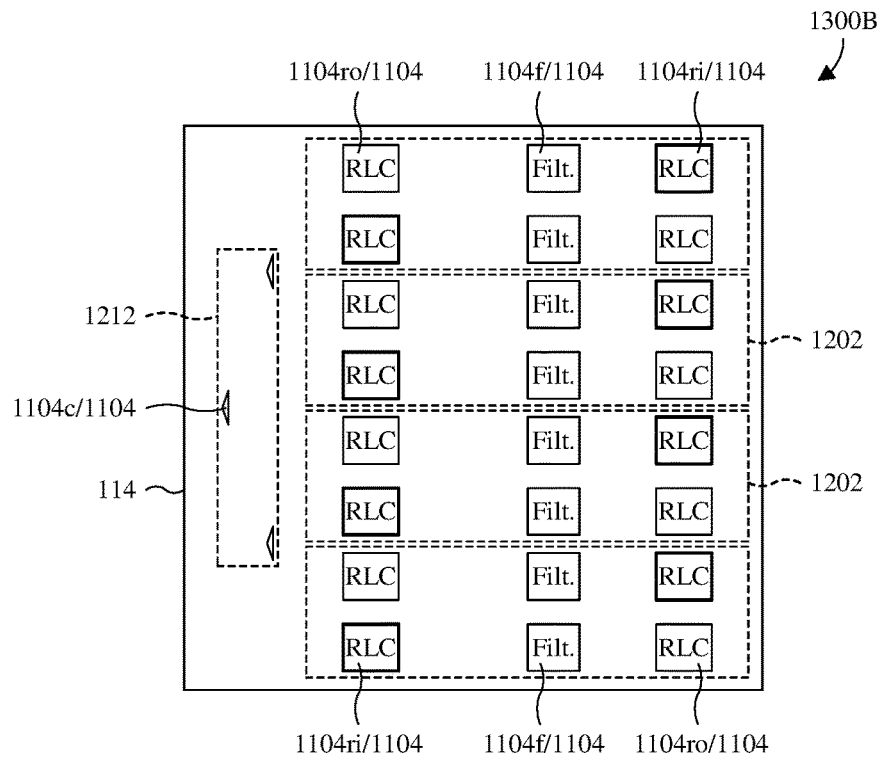

With reference to FIGS. 13A and 13B, schematic views 1300A, 1300B of some embodiments respectively of the first and second IC chips 106, 114 of the 3D IC of FIGS. 11 and 12 are provided in which devices of the 3D IC are split amongst the first and second IC chips 106, 114. For example, the first RF devices 1102 are at the first IC chip 106 as illustrated by FIG. 13A, whereas the second RF devices 1104 are at the second IC chip 114 as illustrated by FIG. 13B. Note that electrical coupling between the first and second RF devices 1102, 1104 is not shown in FIGS. 13A and 13B, but is performed by the first and second frontside interconnect structures 110, 120 illustrated in FIG. 11.

Figure 14:
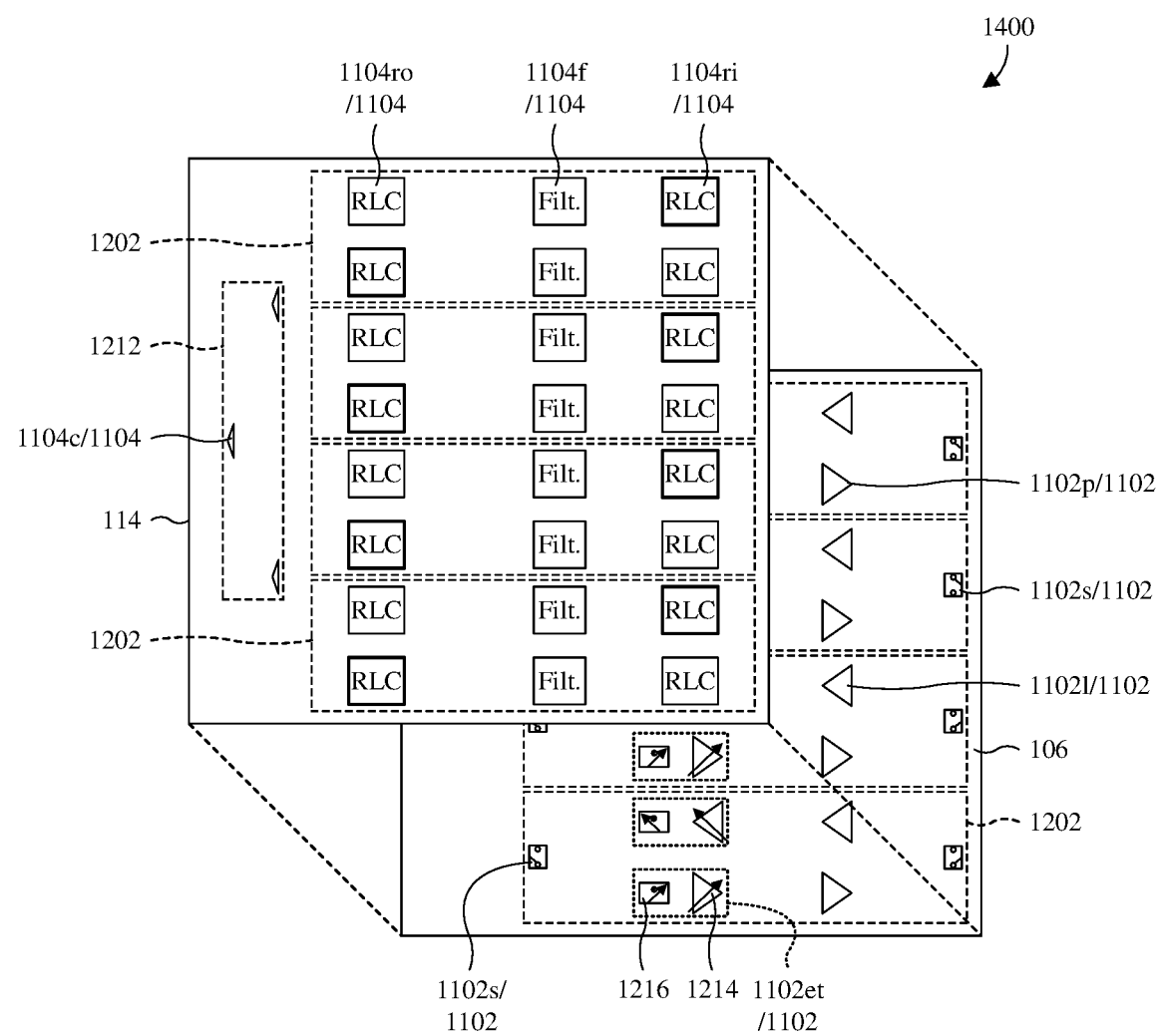
FIG. 14 illustrates a schematic view of some embodiments of the 3D IC of FIGS. 13A and 13B in which a second IC chip is overlaid on a first IC chip.

With reference to FIG. 14, a schematic view 1400 of some embodiments of the 3D IC of FIGS. 13A and 13B is provided in which the second IC chip 114 is overlaid on the first IC chip 106 to schematically represent stacking of the first and second IC chips 106, 114 in the 3D IC. Note that bounds of the RLC input matching networks 1104*ri* have a greater line weight compared to the RLC output matching networks 1104*ro* to schematically distinguish the RLC input matching networks 1104*ri* from the RLC output matching networks 1104*ro*.

Figure 15:
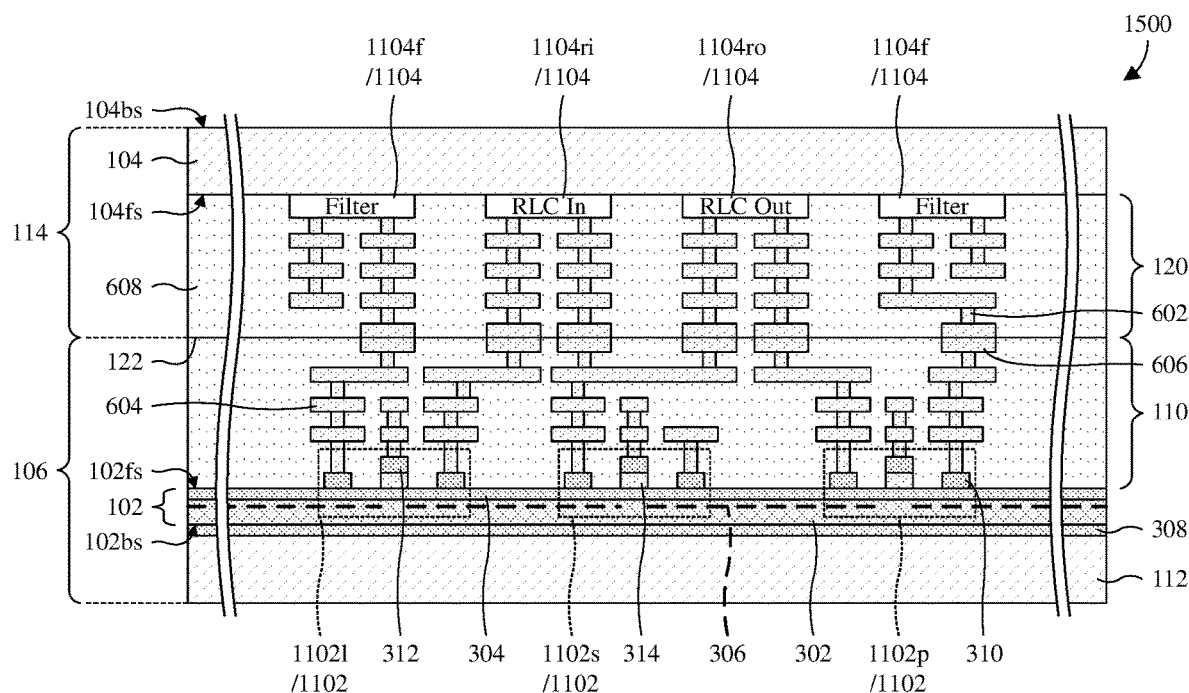
FIG. 15 illustrates a cross-sectional view of some embodiments of the 3D IC of FIG. 11 in which the 3D IC has additional detail.

With reference to FIG. 15, a cross-sectional view 1500 of some embodiments of the 3D IC of FIG. 11 is provided in which constituents of the 3D IC have additional detail. The first semiconductor substrate 102 overlies the support substrate 112 and is or comprises a heterojunction structure. Further, the heterojunction structure comprises a channel layer 302 and a barrier layer 304 as described with regard to FIGS. 3 and 6. The channel layer 302 and the barrier layer 304 are semiconductor layers having unequal bandgaps and are or comprise group III-V semiconductor materials, group II-VI semiconductor materials, or the like. The channel layer 302 underlies and directly contacts the barrier layer 304 at a heterojunction. Further, the channel layer 302 accommodates a two-dimensional carrier gas 306.

A buffer layer 308 separates the first semiconductor substrate 102 and/or the heterojunction from the support substrate 112. In at least some embodiments in which the support substrate 112 is crystalline, the buffer layer 308 may serve as a seed for epitaxially growing the first semiconductor substrate 102 on the support substrate 112 and/or may buffer mismatches between lattice constants, coefficients of thermal expansion, and so on between the first semiconductor substrate 102 and the support substrate 112.

The first RF devices 1102 are or comprise HEMTs as described with regard to FIGS. 3 and 6. However, in alternative embodiments, one, some, or all of the first RF devices 1102 may be MOSFET(s) and/or some other suitable type(s) of active RF device. The first RF devices 1102 comprise individual pairs of source/drain electrodes 310, individual gate electrodes 312 between corresponding source/drain electrodes 310, and individual cap layers 314 separating corresponding gate electrode 312 from the first semiconductor substrate 102.

The first and second frontside interconnect structures 110, 120 comprise a plurality of vias 602, a plurality of wires 604, and a plurality of pads 606 stacked in corresponding interconnect dielectric layers 608 as described with regard to FIG. 6. Such stacking defines conductive paths electrically coupling the first and second RF devices 1102, 1104 together to form a circuit. The circuit may, for example, correspond to a FEM, a transceiver, a MMIC, or the like and/or may, for example, correspond to the circuit at FIG. 12.

Figure 16A:
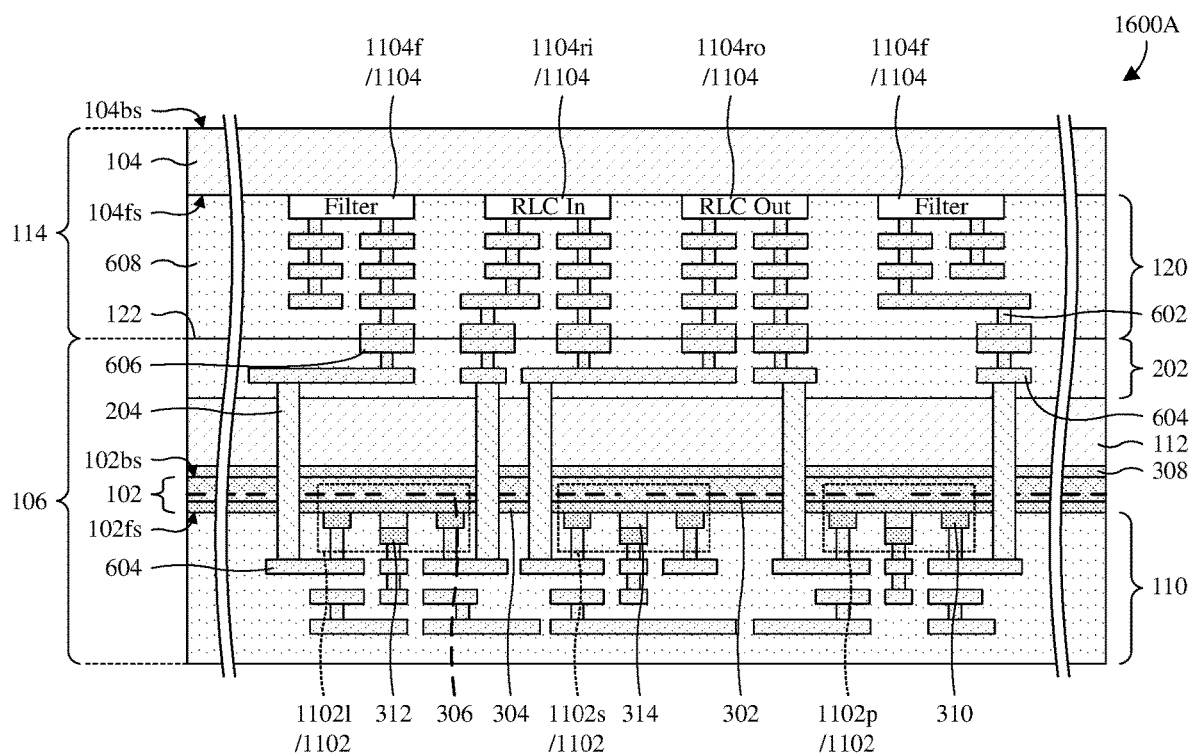
FIGS. 16A-16C illustrate cross-sectional views of some alternative embodiments of the 3D IC of FIG. 15 in which IC chips of the 3D IC have different orientations.
Figure 16B:
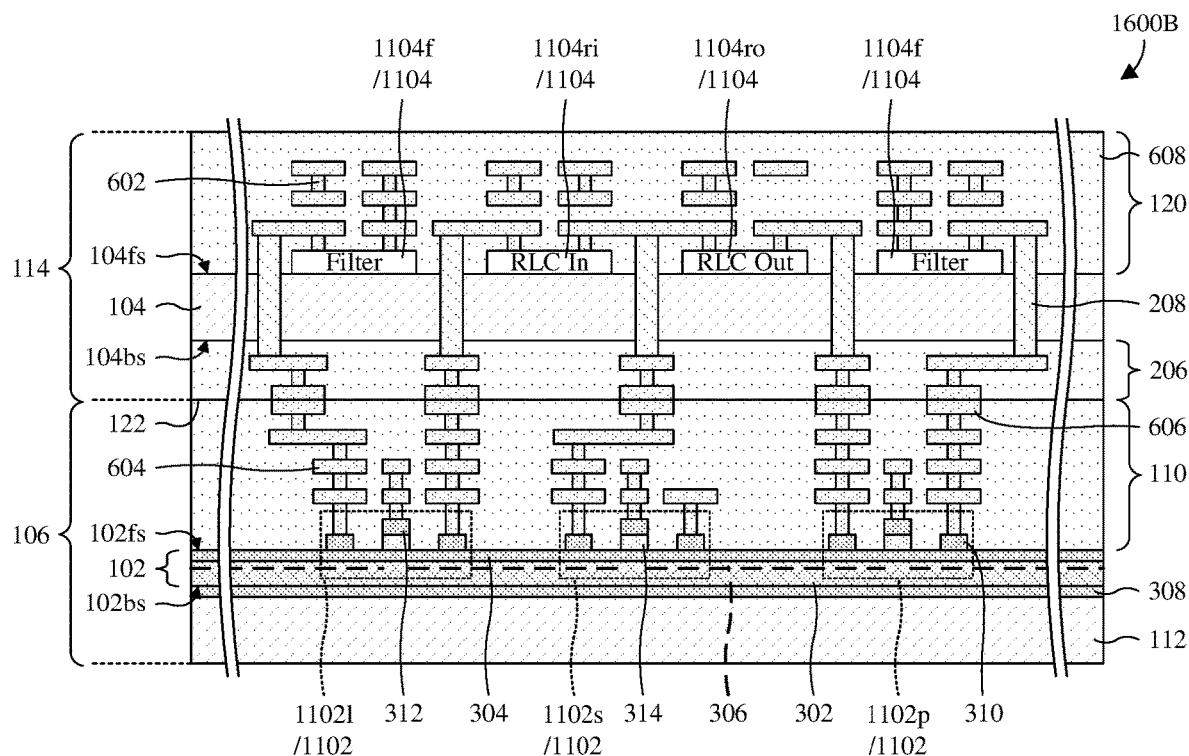
Figure 16C:
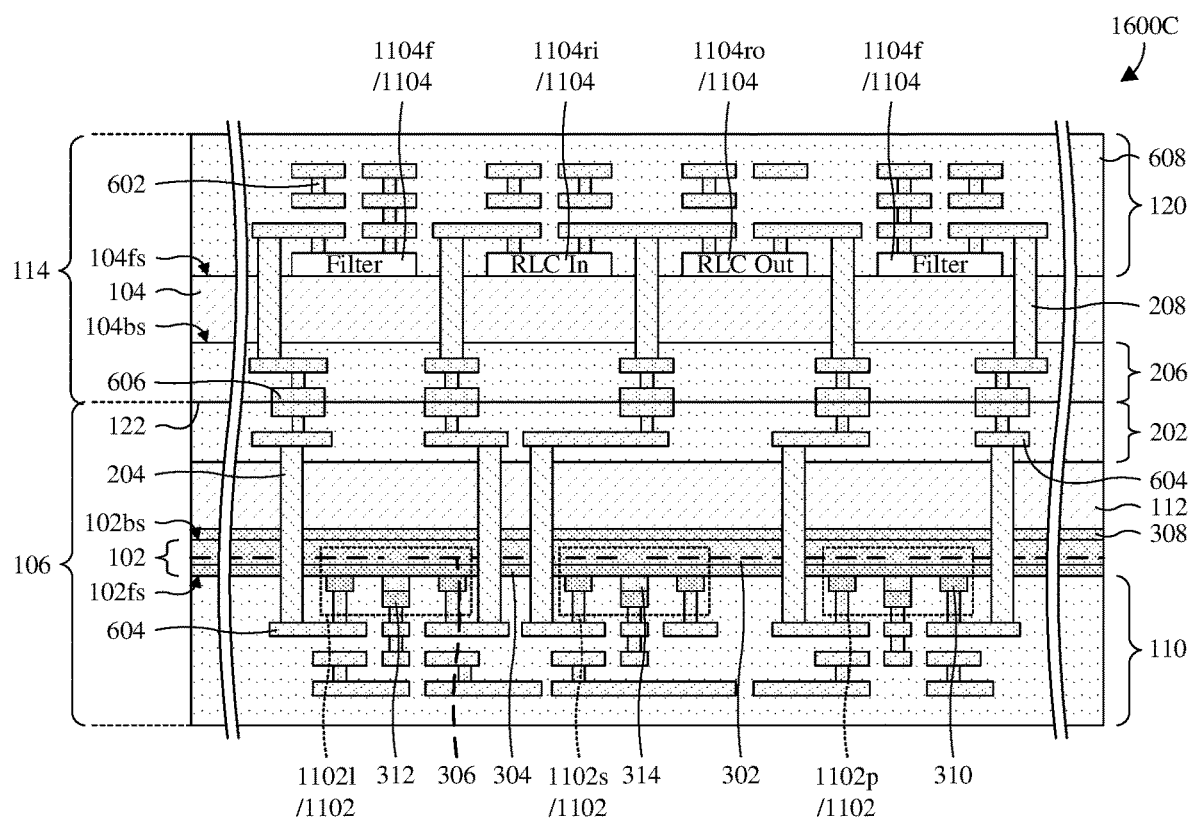

With reference to FIGS. 16A-16C, cross-sectional views 1600A-1600C of some alternative embodiments of the 3D IC of FIG. 15 are provided in which the first and second IC chips 106, 114 of the 3D IC have different orientations.

As illustrated by the cross-sectional view 1600A of FIG. 16A, the first IC chip 106 is vertically flipped, such that the first and second IC chips 106, 114 are bonded together backside to frontside at the bond interface 122. As a result, the first IC chip 106 further comprises a backside interconnect structure 202 and TSVs 204. Note that the TSVs 204 may be separated from the first semiconductor substrate 102 and the support substrate 112 by corresponding TSV dielectric layers (not shown) in some embodiments.

The backside interconnect structure 202 overlies the first semiconductor substrate 102 on the backside 102*bs* of the first semiconductor substrate 102, and the TSVs 204 extend through the first semiconductor substrate 102 from the backside interconnect structure 202 to the first frontside interconnect structure 110 to provide electrical coupling therebetween. The backside interconnect structure 202 is as the first and second frontside interconnect structures 110, 120 are described, whereby the backside interconnect structure 202 comprises a plurality of vias 602, a plurality of wires 604, and a plurality of pads 606 stacked in a corresponding interconnect dielectric layer 608 to define conductive paths.

As illustrated by the cross-sectional view 1600B of FIG. 16B, the second IC chip 114 is vertically flipped, such that the first and second IC chips 106, 114 are bonded together frontside to backside at the bond interface 122. As a result, the second IC chip 114 further comprises a backside interconnect structure 206 and TSVs 208. Note that the TSVs 208 may be separated from the second semiconductor substrate 104 by corresponding TSV dielectric layers (not shown) in some embodiments.

The backside interconnect structure 206 underlies the second semiconductor substrate 104 on the backside 104*bs* of the second semiconductor substrate 104, and the TSVs 208 extend through the second semiconductor substrate 104 from the backside interconnect structure 206 to the second frontside interconnect structure 120 to provide electrical coupling therebetween. The backside interconnect structure 206 is as the first and second frontside interconnect structures 110, 120 are described, whereby the backside interconnect structure 206 comprise a plurality of vias 602, a plurality of wires 604, and a plurality of pads 606 stacked in a corresponding interconnect dielectric layer 608 to define conductive paths.

As illustrated by the cross-sectional view 1600C of FIG. 16C, the first and second IC chips 106, 114 are each vertically flipped, such that the first and second IC chips 106, 114 are bonded together backside to backside at the bond interface 122. The first IC chip 106 is as in FIG. 16A, whereas the second IC chip 114 is as in FIG. 16B.

Figure 17:
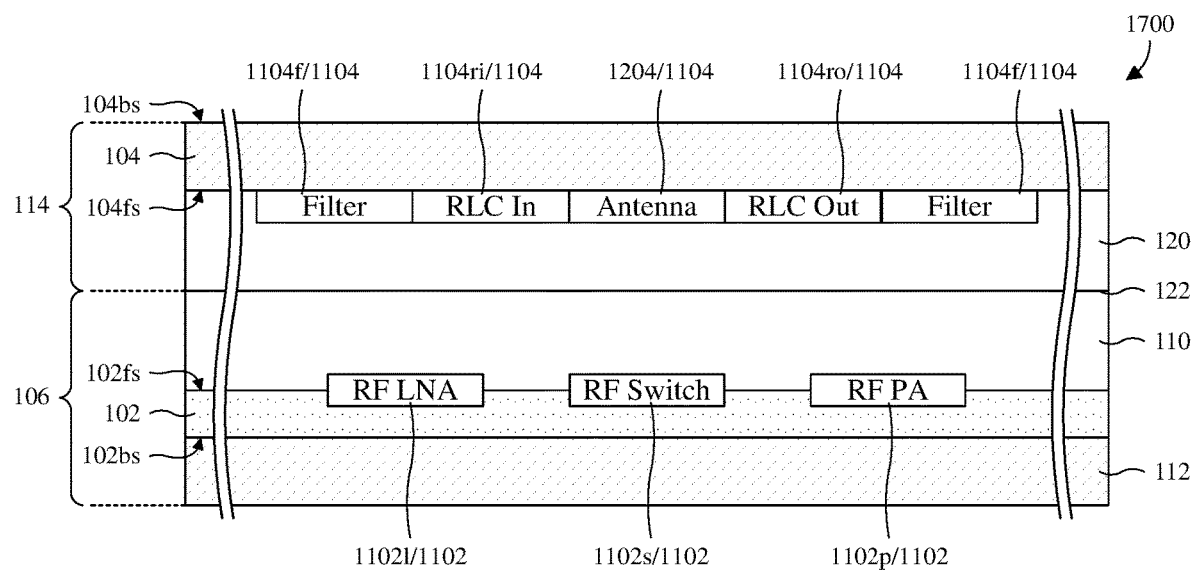
FIG. 17 illustrates a cross-sectional view of some alternative embodiments of the 3D IC of FIG. 11 in which the 3D IC further comprises an antenna.

With reference to FIG. 17, a cross-sectional view 1700 of some alternative embodiments of the 3D IC of FIG. 11 is provided in which the 3D IC further comprises an antenna 1204. The antenna 1204 is included amongst the second RF devices 1104 and is therefore on the second semiconductor substrate 104 at the second IC chip 114.

Figure 18:
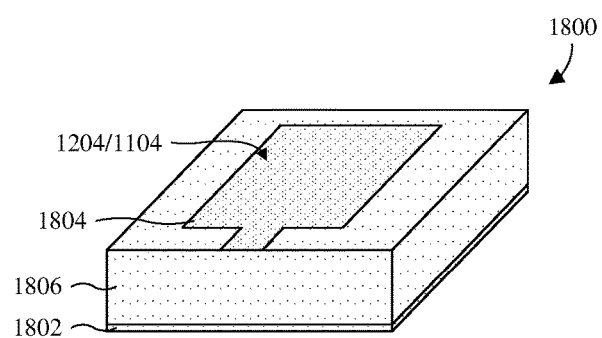
FIG. 18 illustrates a perspective view of some embodiments of the antenna of FIG. 17.

With reference to FIG. 18, a perspective view 1800 of some embodiments of the antenna 1204 of FIG. 17 is provided. The antenna 1204 comprises a conductive ground plate 1802 and a conductive patch 1804 overlying the conductive ground plate 1802. Further, the antenna 1204 comprises a dielectric layer 1806 separating the conductive ground plate 1802 from the conductive patch 1804.

Figure 19:
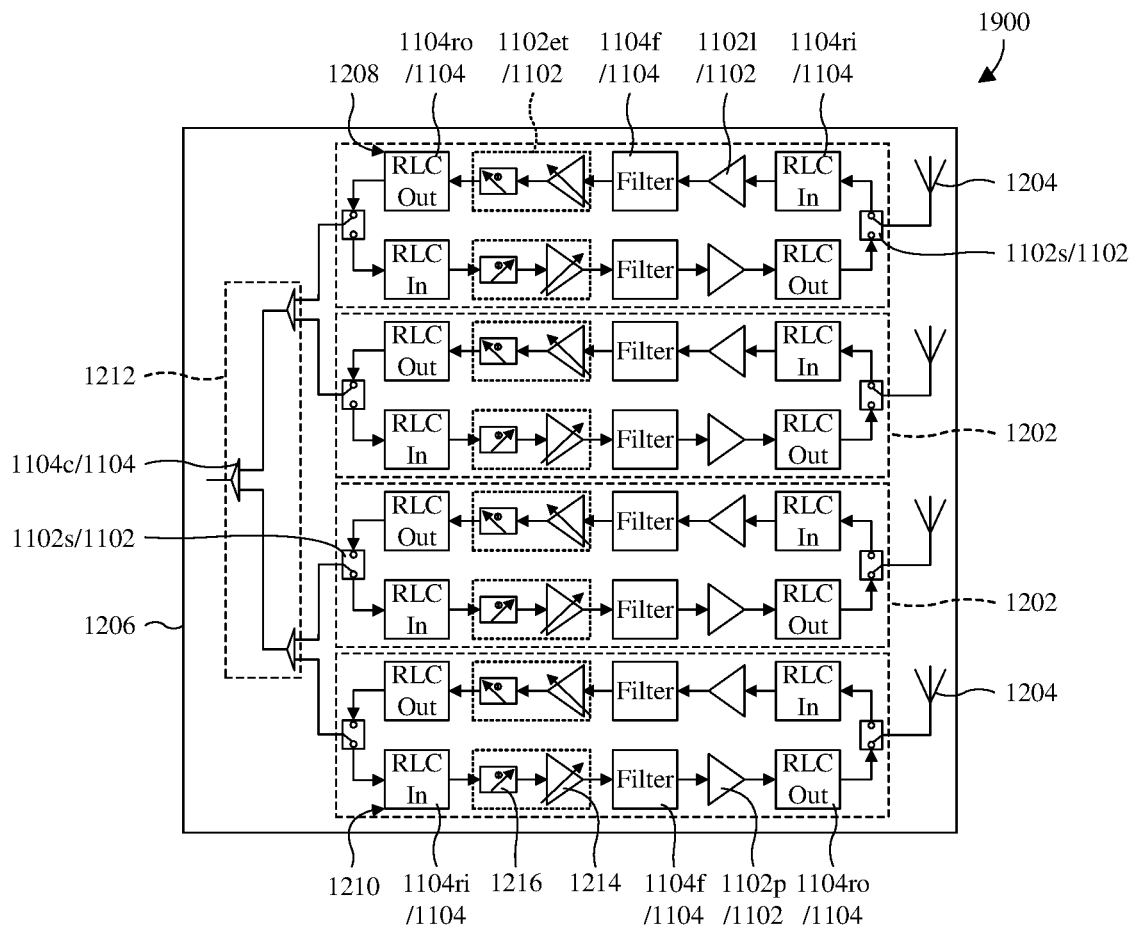
FIG. 19 illustrates a circuit diagram of some embodiments of the 3D IC of FIG. 17.

With reference to FIG. 19, a circuit diagram 1900 of some embodiments of the 3D IC of FIG. 17 is provided. The circuit diagram 1900 is as the circuit diagram 1200 of FIG. 12 is described, except that the antennas 1204 are included in the 3D IC. For clarity, bounds of the 3D IC are schematically represented by the box 1206. The antennas 1204 may, for example, each be as illustrated and described with regard to FIG. 18.

Figure 20:
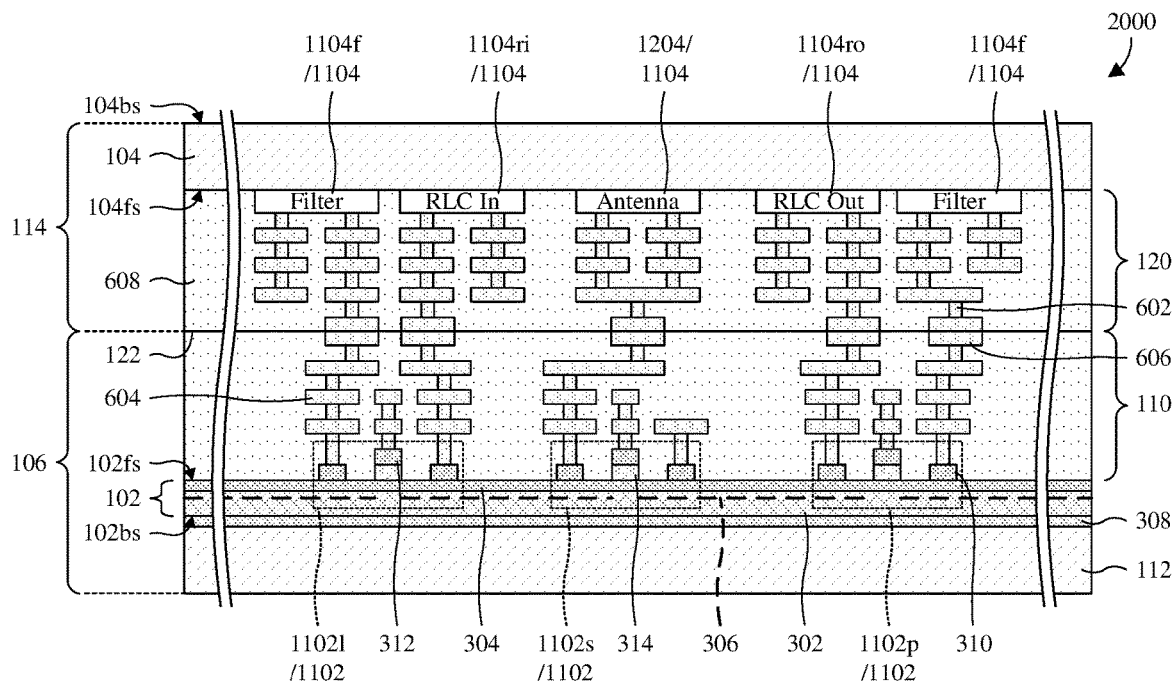
FIG. 20 illustrates a cross-sectional view of some embodiments of the 3D IC of FIG. 17 in which the 3D IC has additional detail.

With reference to FIG. 20, a cross-sectional view 2000 of some embodiments of the 3D IC of FIG. 17 is provided in which constituents of the 3D IC have additional detail. In particular, the 3D IC is as illustrated and described with regard to FIG. 15, except that the 3D IC further comprises the antenna 1204 on the second semiconductor substrate 104. In alternative embodiments, the first and second IC chips 106, 114 may be bonded together backside to frontside, frontside to backside, and backside to backside respectively as in FIGS. 16A-16C. Put another way, the antenna 1204 may be on the second semiconductor substrate 104 in alternative embodiments of the 3D ICs of FIGS. 16A-16C.

Figure 21:
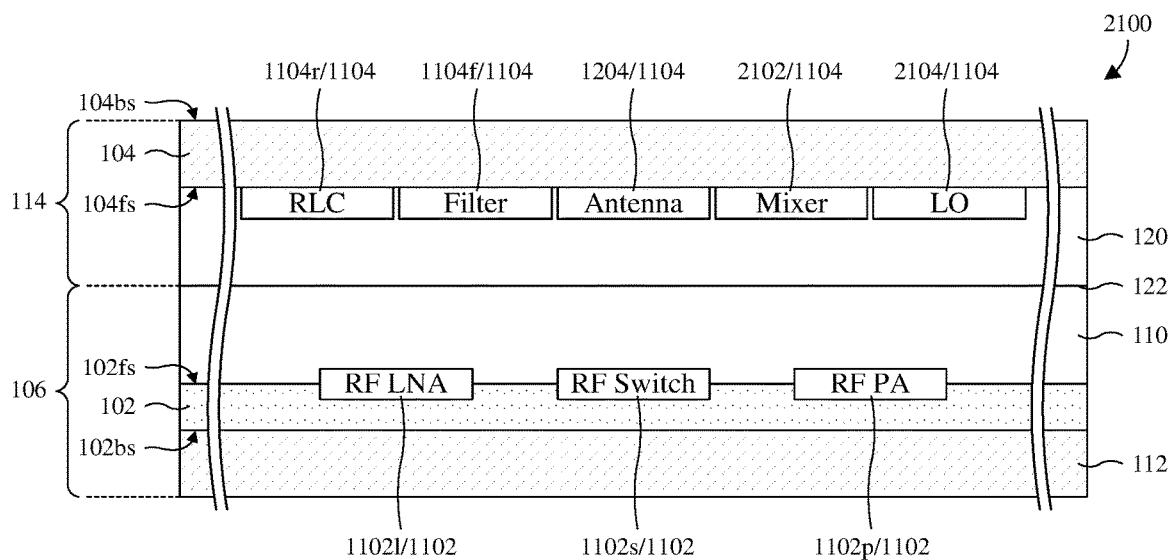
FIG. 21 illustrates a cross-sectional view of some alternative embodiments of the 3D IC of FIG. 11 in which the 3D IC further comprises a mixer and a local oscillator.

With reference to FIG. 21, a cross-sectional view 2100 of some alternative embodiments of the 3D IC of FIG. 11 is provided in which the 3D IC further comprises an antenna 1204, a mixer 2102, a local oscillator 2104, and an RLC matching network 1104r. Note that the RLC matching network 1104r may correspond to the RLC input matching network 1104ri of FIG. 11 or the RLC output matching network 1104ro of FIG. 11. The antenna 1204, the mixer 2102, and the local oscillator 2104 are included amongst the second RF devices 1104 and are therefore on the second semiconductor substrate 104 at the second IC chip 114. In alternative embodiments, the mixer 2102 and/or and the local oscillator 2104 is/are included amongst the first RF devices 1102 and is/are therefore on the first semiconductor substrate 102 at the first IC chip 106. The first and second RF devices 1102, 1104 may, for example, be interconnected by the first and second frontside interconnect structures 110, 120 to define a FEM, a transceiver, an MMIC, or some other suitable RF circuit.

Figure 22:
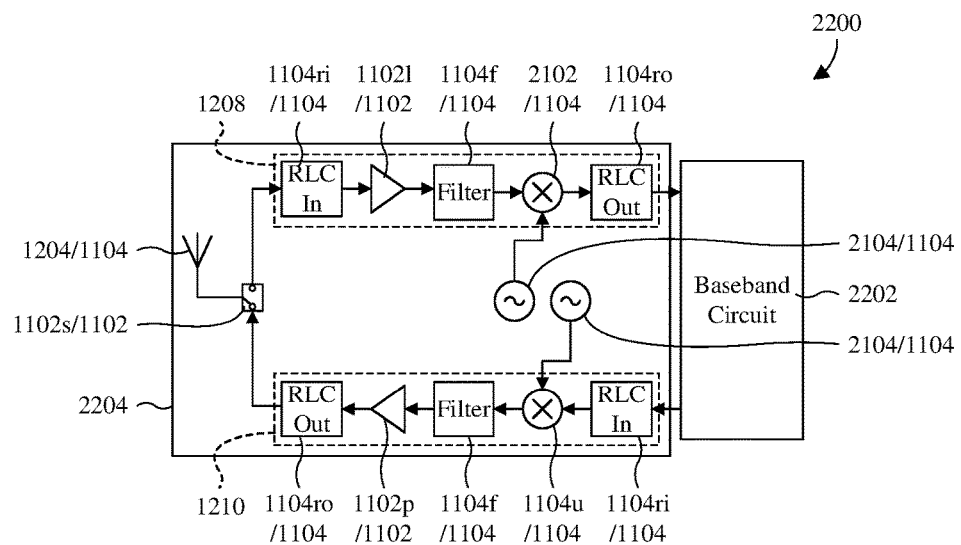
FIG. 22 illustrates a circuit diagram of some embodiments of the 3D IC of FIG. 21.

With reference to FIG. 22, a circuit diagram 2200 of some embodiments of the 3D IC of FIG. 21 is provided in which the 3D IC comprises a receive chain 1208, a transmit chain 1210, an RF switch 1102s, an antenna 1204, and a plurality of local oscillators 2104. The RF switch 1102s is included amongst the first RF devices 1102 of FIG. 21 and hence is on and partially formed by the first semiconductor substrate 102 of FIG. 21. The antenna 1204 and the local oscillators 2104 are included amongst the second RF devices 1104 of FIG. 21 and hence are on and partially formed by the second semiconductor substrate 104 of FIG. 21. In alternative embodiments, the antenna 1204 is external to the 3D IC. Further, in alternative embodiments, the local oscillators 2104 are included amongst the first RF devices 1102 of FIG. 21 and hence are on and partially formed by the first semiconductor substrate 102 of FIG. 21.

The receive and transmit chains 1208, 1210 are configured to electrically couple to a baseband processing circuit 2202, which is external to the 3D IC. For clarity, bounds of the 3D IC are schematically represented by a box 2204 separating the Rx/Tx chain pairs 1202 from the baseband processing circuit 2202. The baseband processing circuit 2202 may, for example, be configured for demodulation, analog-to-digital conversion, digital signal processing, baseband processing, digital-to-analog conversion, modulation, and so on. Additionally, the receive and transmit chains 1208, 1210 are electrically coupled to the RF switch 1102s, which is configured to selectively electrically couple the receive and transmit chains 1208, 1210 to the antenna 1204. In a transmit mode, the RF switch 1102s is configured to electrically couple the transmit chain 1210 to the antenna 1204. In a receive mode, the RF switch 1102s is configured to electrically couple the receive chain 1208 to the antenna.

The receive and transmit chains 1208, 1210 comprise corresponding filters 1104f, corresponding RLC input matching network 1104ri, and corresponding RLC output matching network 1104ro. Further, the receive chain 1208 comprises a LNA 1102l and a mixer 2102, whereas the transmit chain 1210 comprises a PA 1102p and an up-converter 1104u. The LNA 1102l and the PA 1102p are included amongst the first RF devices 1102 of FIG. 21 and hence are on and partially formed by the first semiconductor substrate 102 of FIG. 21. The RLC input and output matching networks 1104ri, 1104ro correspond to the RLC matching network of FIG. 21. The RLC input matching networks 1104ri, the RLC output matching networks 1104ro, the filters 1104f, the mixer 2102, and the up-converter 1104u are included amongst the second RF devices 1104 of FIG. 21 and hence are on and partially formed by the second semiconductor substrate 104 of FIG. 21. Further, the mixer 2102 and the up-converter 1104u correspond to the local oscillators 2104 with a one-to-one correspondence or some other suitable correspondence.

Figure 23:
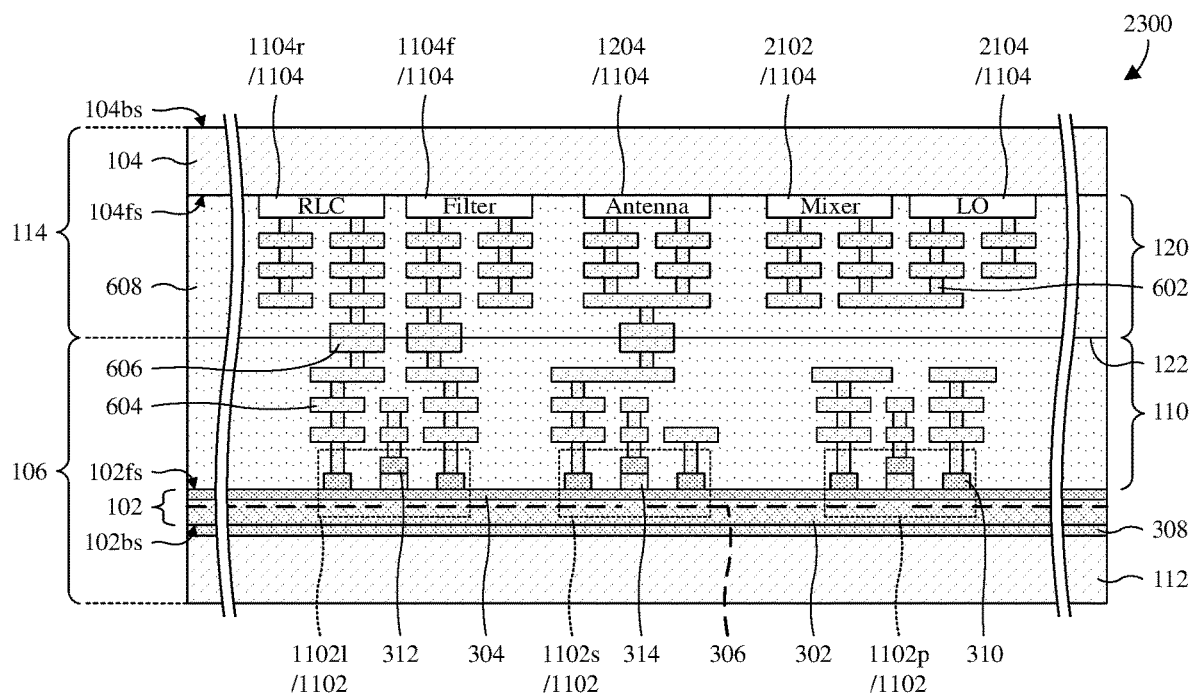
FIG. 23 illustrates a cross-sectional view of some embodiments of the 3D IC of FIG. 21 in which the 3D IC has additional detail.

With reference to FIG. 23, a cross-sectional view 2300 of some embodiments of the 3D IC of FIG. 21 is provided in which constituents of the 3D IC have additional detail. In particular, the 3D IC is as illustrated and described with regard to FIG. 15, except that the 3D IC further comprises the antenna 1204, the mixer 2102, and the local oscillator 2104. In alternative embodiments, the first and second IC chips 106, 114 may be bonded together backside to frontside, frontside to backside, and backside to backside respectively as in FIGS. 16A-16C.

Figure 24:
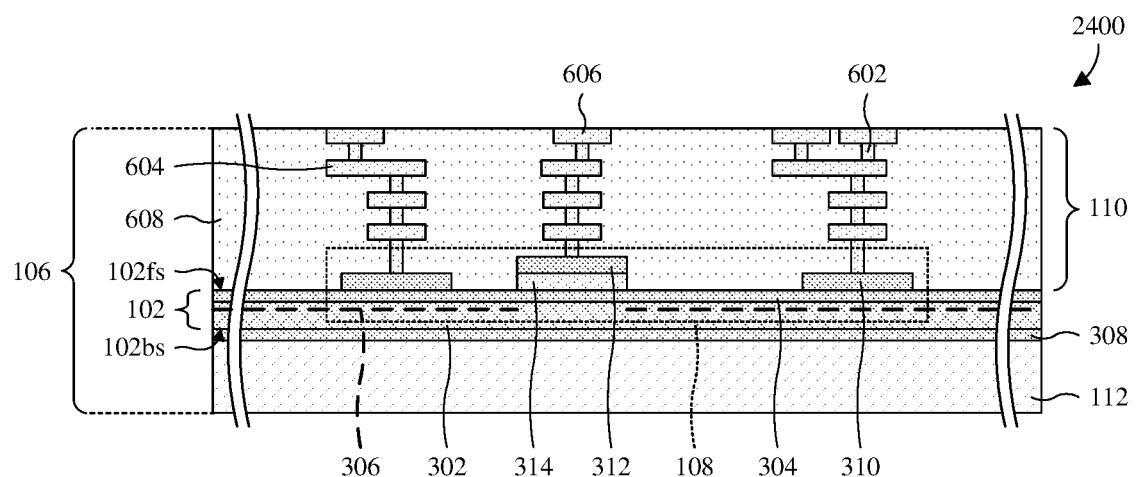
FIGS. 24-26 illustrate a series of cross-sectional views of some embodiments of a method for forming a 3D IC comprising semiconductor substrates with different bandgaps.
Figure 25:
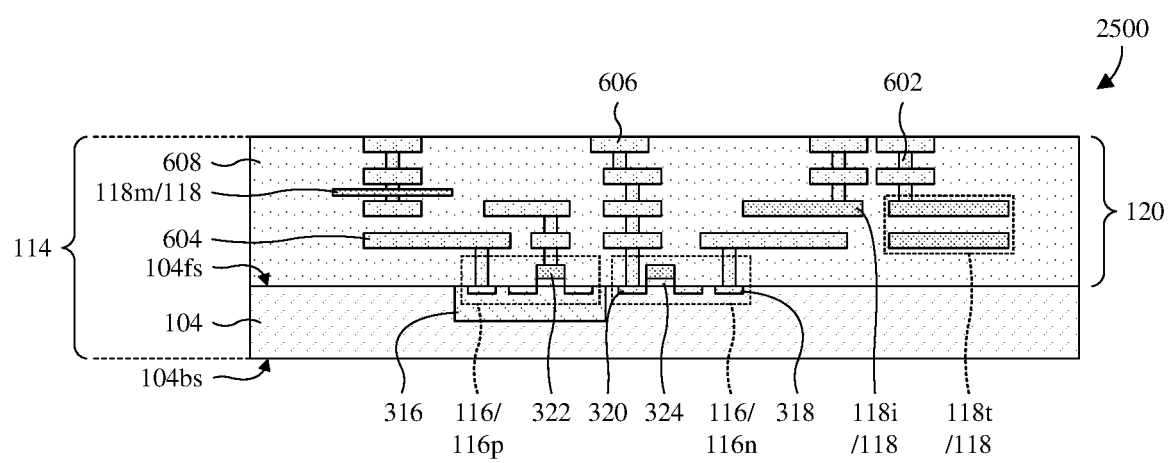
Figure 26:
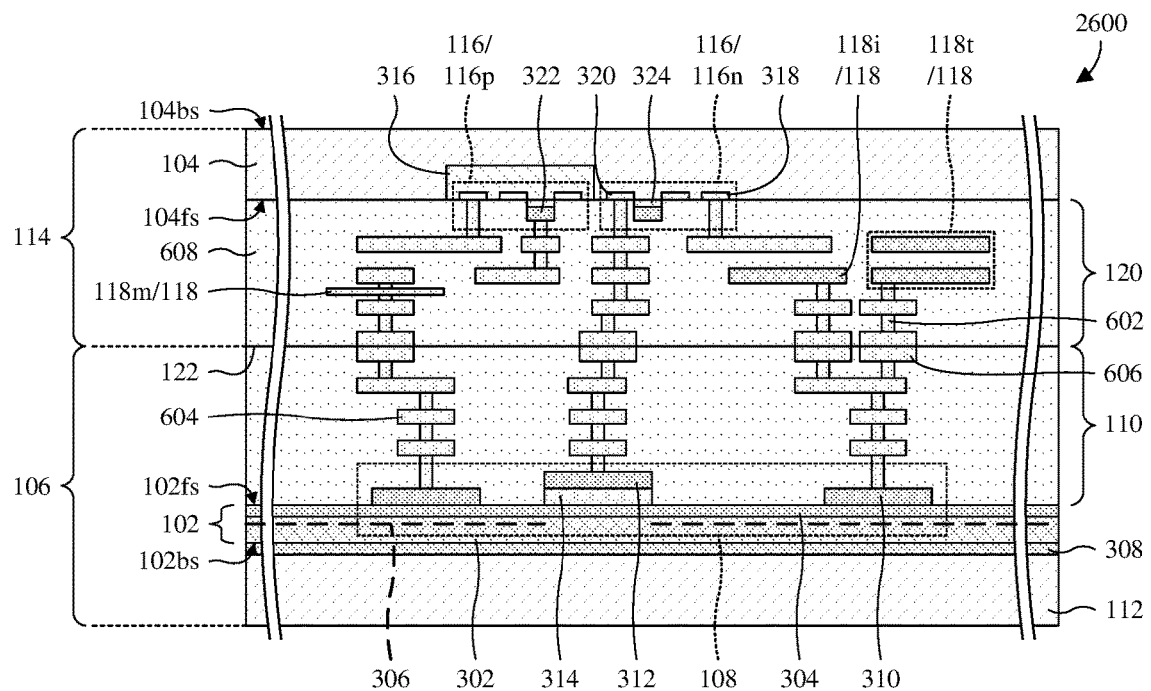

With reference to FIGS. 24-26, a series of cross-sectional views 2400-2600 of some embodiments of a method for forming a 3D IC comprising semiconductor substrates with different bandgaps is provided. As seen hereafter, the method may, for example, be employed to form the 3D IC of FIG. 6 or some other suitable 3D IC.

As illustrated by the cross-sectional view 2400 of FIG. 24, a first IC chip 106 is formed. More particularly, a first semiconductor substrate 102 is formed overlying a support substrate 112, such that the support substrate 112 is on a backside 102bs of the first semiconductor substrate. Further, a first active device 108 and a first frontside interconnect structure 110 are formed overlying the first semiconductor substrate 102 on a frontside 102fs of the first semiconductor substrate, opposite the backside 102bs.

The first semiconductor substrate 102 is or comprises a heterojunction structure. Further, the heterojunction structure comprises a channel layer 302 and a barrier layer 304 as described with regard to FIGS. 3 and 6. The channel layer 302 and the barrier layer 304 are semiconductor layers having unequal bandgaps and are or comprise group III-V semiconductor materials, group II-VI semiconductor materials, or the like. The channel layer 302 underlies and directly contacts the barrier layer 304 at a heterojunction. Further, the channel layer 302 accommodates a two-dimensional carrier gas 306.

A buffer layer 308 separates the first semiconductor substrate 102 and/or the heterojunction from the support substrate 112. In at least some embodiments in which the support substrate 112 is crystalline, the buffer layer 308 may serve as a seed for epitaxially growing the first semiconductor substrate 102 on the support substrate 112 and/or may buffer mismatches between lattice constants, coefficients of thermal expansion, and so on between the first semiconductor substrate 102 and the support substrate 112.

In some embodiments, the support substrate 112 is or comprises monocrystalline silicon, silicon carbide, sapphire, or some other suitable semiconductor material. In some embodiments, the first semiconductor substrate 102 and the support substrate 112 form a composite substrate. To the extent that the first semiconductor substrate 102 is or comprises GaN and the support substrate is or comprises monocrystalline silicon, silicon carbide, or sapphire, the composite substrate may be or comprise a GaN on silicon substrate, a GaN on silicon carbide substrate, or a GaN on sapphire substrate.

The first active device 108 is between the first semiconductor substrate 102 and the first frontside interconnect structure 110 and is partially formed by the first semiconductor substrate 102. Further, the first active device 108 is or comprises a HEMT as described with regard to FIGS. 3 and 6. In alternative embodiments, the first active device 108 may be some other suitable type of active device. The first active devices 108 comprise a pair of source/drain electrode 310, a gate electrode 312 between the source/drain electrodes 310, and a cap layer 314 separating the gate electrode 312 from the first semiconductor substrate 102.

The first frontside interconnect structures 110 comprises a plurality of vias 602, a plurality of wires 604, and a plurality of pads 606 stacked in an interconnect dielectric layer 608 as described with regard to FIG. 6. Such stacking defines conductive paths extending from the first active device 108 to facilitate formation of a circuit.

As illustrated by a cross-sectional view 2500 of FIG. 25, a second IC chip 114 is formed. More particularly, a plurality of second active device 116, a plurality of passive devices 118, and a second frontside interconnect structure 120 are formed on a frontside 104fs of a second semiconductor substrate 104 which is opposite a backside 104bs of the second semiconductor substrate 104.

The second active devices 116 are between the second semiconductor substrate 104 and the second frontside interconnect structure 120 and are partially formed by the second semiconductor substrate 104. Further, the second active devices 116 comprises a p-type MOSFET 116p and an n-type MOSFET 116n. In alternative embodiments, the second active devices 116 have some other suitable configuration or are some other suitable type of active device. The p-type MOSFET 116p is at an n-type well 316 in the second semiconductor substrate 104, and the n-type MOSFET 116n is at a bulk of the second semiconductor substrate 104. In alternative embodiments, the n-type well 316 is omitted, the p-type MOSFET 116p is at the bulk of the second semiconductor substrate 104, and the n-type MOSFET 116n is at a p-type well in the second semiconductor substrate 104. The second active devices 116 comprise individual body contact regions 318, individual source/drain regions 320, individual gate electrodes 322, and individual gate dielectric layers 324.

The passive devices 118 are in the second frontside interconnect structure 120. In alternative embodiments, one, some, or all of the passive devices 118 is/are in the first frontside interconnect structure 110 of FIG. 24. Further, the passive devices 118 comprise a metal-insulator-metal (MIM) capacitor 118m, an inductor 118i, and a transformer 118t. In alternative embodiments, more or less passive devices and/or different types of passive devices than those illustrated may be in the second frontside interconnect structure 120.

The second semiconductor substrate 104 has a different bandgap than the first semiconductor substrate 102. For example, the first semiconductor substrate 102 may have a larger or wider bandgap than the second semiconductor substrate 104 or vice versa. In some embodiments in which the first semiconductor substrate 102 has the larger bandgap, the first semiconductor substrate 102 may be or comprise GaN or the like, whereas the second semiconductor substrate 104 may be or comprise monocrystalline silicon or the like.

The second frontside interconnect structures 120 comprises a plurality of vias 602, a plurality of wires 604, and a plurality of pads 606 stacked in an interconnect dielectric layer 608 as described with regard to FIG. 6. Such stacking defines conductive paths extending from the second active devices 116 and the passive devices 118 to facilitate formation of a circuit.

As illustrated by a cross-sectional view 2600 of FIG. 26, the second IC chip 114 is vertically flipped and is bonded to the first IC chip 106 frontside to frontside at a bond interface 122. The bonding is performed frontside to frontside in that the frontside 102fs of the first semiconductor substrate 102 and the frontside 104fs of the second semiconductor substrate 104 face each other. The bonding comprises both: 1) bonding (e.g., direct bonding, fusion bonding, etc.) between the interconnect dielectric layers 608 of the first and second frontside interconnect structures 110, 120; and 2) bonding (e.g., direct bonding, fusion bonding, etc.) between the pads 606 of the first and second frontside interconnect structures 110, 120. The first and second semiconductor substrates 102, 104 may, for example, correspond to portions of semiconductor wafers before singulation, whereby the bonding may, for example, be regarded as wafer-to-wafer bonding or the like.

By bonding the first and second IC chips 106, 114 together, the first and second IC chips 106, 114 are physical secured to each other and are electrically coupled to each other. Such electrical coupling forms a circuit. The circuit may, for example, be a full-bridge power converter, an LLC power converter, or the like. An example of the LLC power converter is at FIG. 4A, whereas an example of the full-bridge power converter is at FIG. 4B.

In at least some embodiments in which the circuit is the LLC power converter of FIG. 4A, the HEMTs 402*h* of FIG. 4A are formed on and partially formed by the first semiconductor substrate 102 and the first active device 108 corresponds to one of these HEMTs 402*h*. Further, the passive devices 404 of FIG. 4A are formed at the second IC chip 114 and correspond to the passive devices 118. For example, the MIM capacitor 118*m* may correspond to one of the capacitors 404*c* of FIG. 4A, the transformer 118*t* may correspond to the transformer 404*t* of FIG. 4A, and the inductor 118*i* may correspond to one of the inductors 404*i* of FIG. 4A.

In at least some embodiments in which the circuit is the full-bridge power converter of FIG. 4B, the HEMTs 406*h* of FIG. 4B are formed on and partially formed by the first semiconductor substrate 102 and the first active device 108 corresponds to one of these HEMTs 406*h*. Further, the MOSFETs 406*m* of FIG. 4B are formed on and partially formed by the second semiconductor substrate 104 and the second active devices 108 correspond to these MOSFETs 406*m*. Further yet, the passive devices 408 of FIG. 4B are formed at the second IC chip 114 and correspond to the passive device 118. For example, the MIM capacitor 118*m* may correspond to one of the capacitors 408*c* of FIG. 4B, the transformer 118*t* may correspond to the transformer 408*t* of FIG. 4B, and the inductor 118*i* may correspond to one of the inductors 408*i* of FIG. 4B.

As noted above, the first semiconductor substrate 102 may have a larger or wider bandgap than the second semiconductor substrate 104. To the extent that the first semiconductor substrate 102 has the larger bandgap, active devices that benefit from the larger bandgap (e.g., the first active device 108) are on and partially formed by the first semiconductor substrate 102. Active devices used for power supplies, power conversion, and so on tend to benefit from the larger bandgap because the larger bandgap enables operation at higher frequencies, higher voltages, and higher temperatures. Further, active devices that don't benefit or minimally benefit from the larger bandgap (e.g., the second active devices 116) may be formed on the second semiconductor substrate 104. At least when the second semiconductor substrate 104 is or comprises monocrystalline silicon, this may reduce cost because forming active devices using non-silicon substrates tends to be more costly than using silicon substrates.

Additionally, because the first and second IC chips 106, 114 are vertically stacked, wire length between the first and second IC chips 106, 114 is small and area consumed by the 3D IC is small. The small wire lengths may lead to reduced parasitic inductance and capacitance and may hence enhance performance. The small area may allow enhanced functional density on a PCB or other substrate to which the 3D IC is mounted and may hence reduce costs.

While the first and second IC chips 106, 114 are illustrated as being bonded together frontside to frontside, the first and second IC chips 106, 114 may alternatively be bonded together backside to frontside, frontside to backside, or backside to backside respectively as illustrated at FIGS. 7A-7C. In such alternative embodiments, the first IC chip 106 is further formed at FIG. 24 with a backside interconnect structure 202 and TSVs 204 and/or the second IC chip 114 is further formed at FIG. 25 with a backside interconnect structure 206 and TSVs 208.

In some embodiments, the first and second semiconductor substrates 102, 104 correspond to portions of semiconductor wafers. In at least some of such embodiments, the method may proceed from the acts of FIG. 26 to singulation of the semiconductor wafers, thereby separating the first and second IC chips 106, 114 from replicas of the first and second IC chips 106, 114 on the semiconductor wafers. Additionally, in at least some embodiments, the method may proceed from the acts of FIG. 26 to packaging of the 3D IC formed by the first and second IC chips 106, 114.

While FIGS. 24-26 are described with reference to a method, it will be appreciated that the structures shown in FIGS. 24-26 are not limited to the method but rather may stand alone separate of the method. While FIGS. 24-26 are described as a series of acts, it will be appreciated that the order of the acts may be altered in other embodiments. While FIGS. 24-26 illustrate and describe as a specific set of acts, some acts that are illustrated and/or described may be omitted in other embodiments. Further, acts that are not illustrated and/or described may be included in other embodiments. For example, while FIGS. 24-26 focus on formation of the 3D IC using chip-to-chip or wafer-to-wafer bonding, the 3D IC may be alternatively formed by transferring the second semiconductor substrate 104 to the first IC chip 106 or by depositing the second semiconductor substrate 104 on the first IC chip 106. In both cases, the second active devices 116, the passive devices 118, and the second frontside interconnect structure 120 are be formed on the second semiconductor substrate 104 after the transfer or the deposition. FIGS. 2G and 2H provide non-limiting examples of such 3D ICs.

Figure 27:
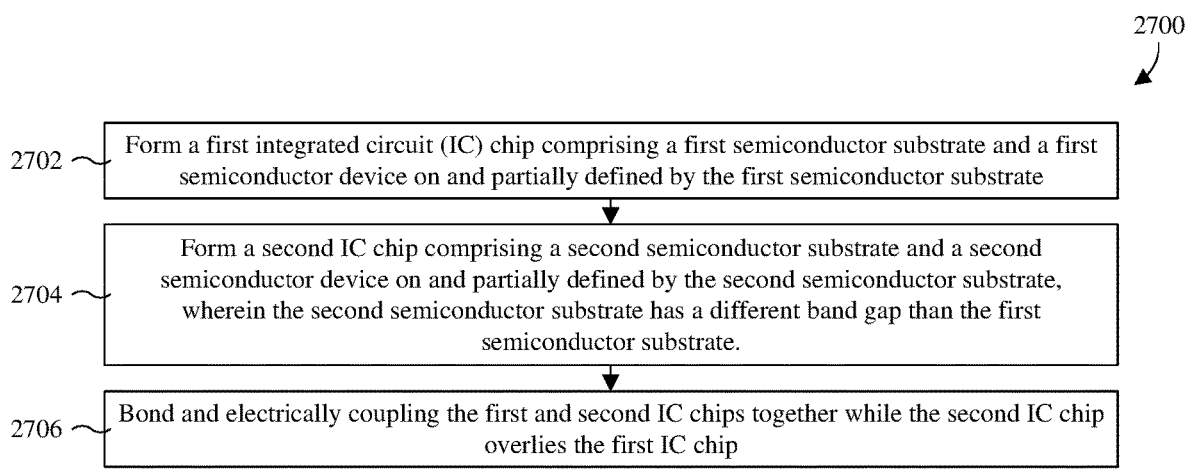
FIG. 27 illustrates a block diagram of some embodiments of the method of FIGS. 24-26.

With reference to FIG. 27, a block diagram 2700 of some embodiments of the method of FIGS. 24-26 is provided.

At 2702, a first IC chip is formed. The first IC chip comprises a first semiconductor substrate and a first semiconductor device on and partially formed by the first semiconductor substrate. See, for example, FIG. 24.

At 2704, a second IC chip is formed. The second IC chip comprises a second semiconductor substrate and a second semiconductor device on and partially formed by the second semiconductor substrate. Further, the second semiconductor substrate has a different bandgap than the first semiconductor substrate. For example, the first semiconductor substrate may be or comprise GaN, whereas the second semiconductor substrate may be or comprise silicon. Other suitable materials are, however, amenable. See, for example, FIG. 25.

At 2706, the first and second IC chips are bonded and electrically coupled together while the second IC chip overlies the first IC chip. Such bonding may, for example, be performed frontside to frontside, backside to frontside, frontside to backside, or backside to backside. Further, the bonding forms a circuit spread across the first and second IC chips. The circuit may, for example, be or comprise a full-bridge power converter, an LLC power converter, or some other suitable circuit. See, for example, FIG. 26.

While the block diagram 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 28:
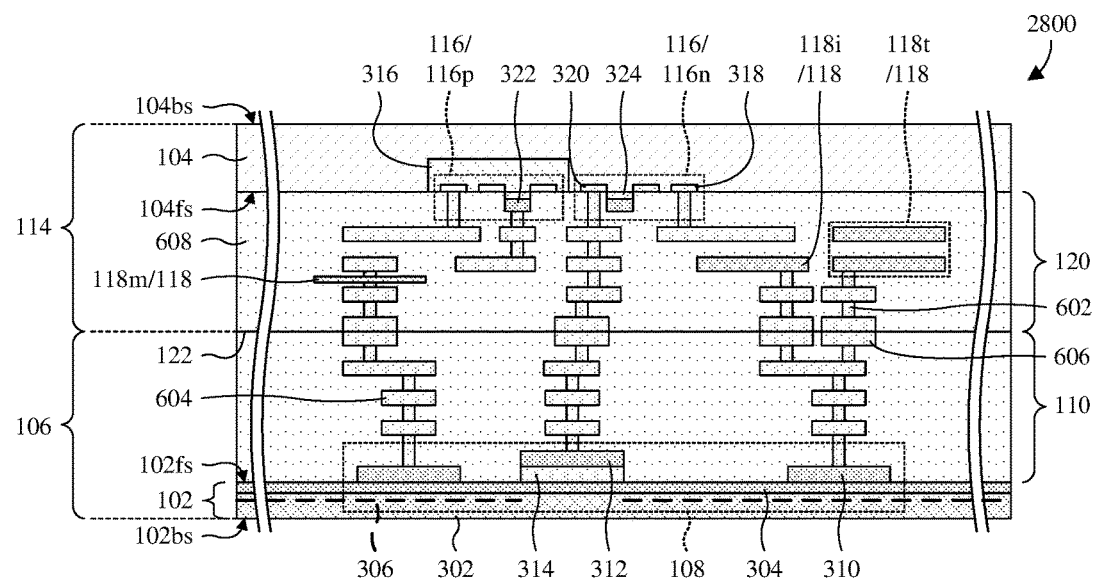
FIG. 28 illustrates a cross-sectional view of some embodiments of an additional processing step that may be performed as part of the method of FIGS. 24-26.

As illustrated above, the method of FIGS. 24-26 may complete with the support substrate 112 on the backside 102*bs* of the first semiconductor substrate 102 and the 3D IC may then proceed to packaging with the support substrate 112 in place. However, in alternative embodiments of the method of FIGS. 24-26, the method may further include removing the support substrate 112 as illustrated by a cross-sectional view 2800 of FIG. 28. The removal may, for example, occur after the bonding at FIG. 26 and may, for example, be performed by etching, chemical mechanical planarization (CMP), some other suitable removal process (es), or any combination of the foregoing. Removing the support substrate 112 may, for example, reduce RF substrate loss and/or enhance thermal dissipation.

Figure 29:
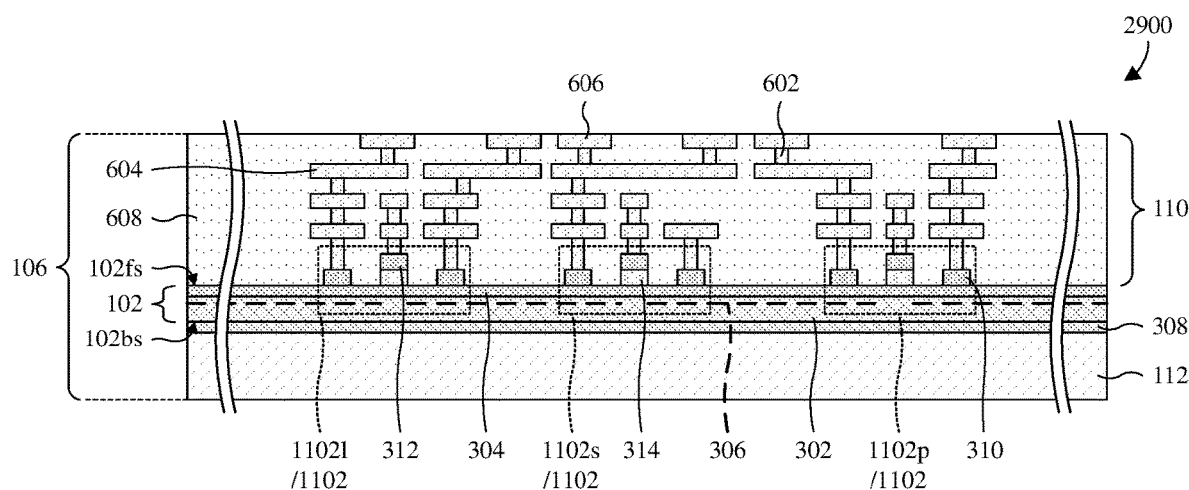
FIGS. 29-31 illustrate a series of cross-sectional views of some alternative embodiments of the method of FIGS. 24-26 is provided in which devices of the 3D IC correspond to RF.
Figure 30:
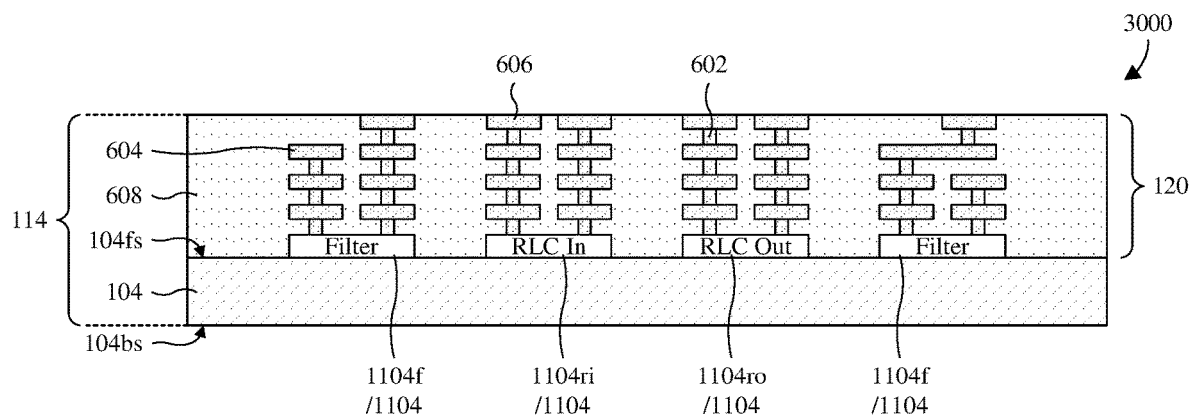
Figure 31:
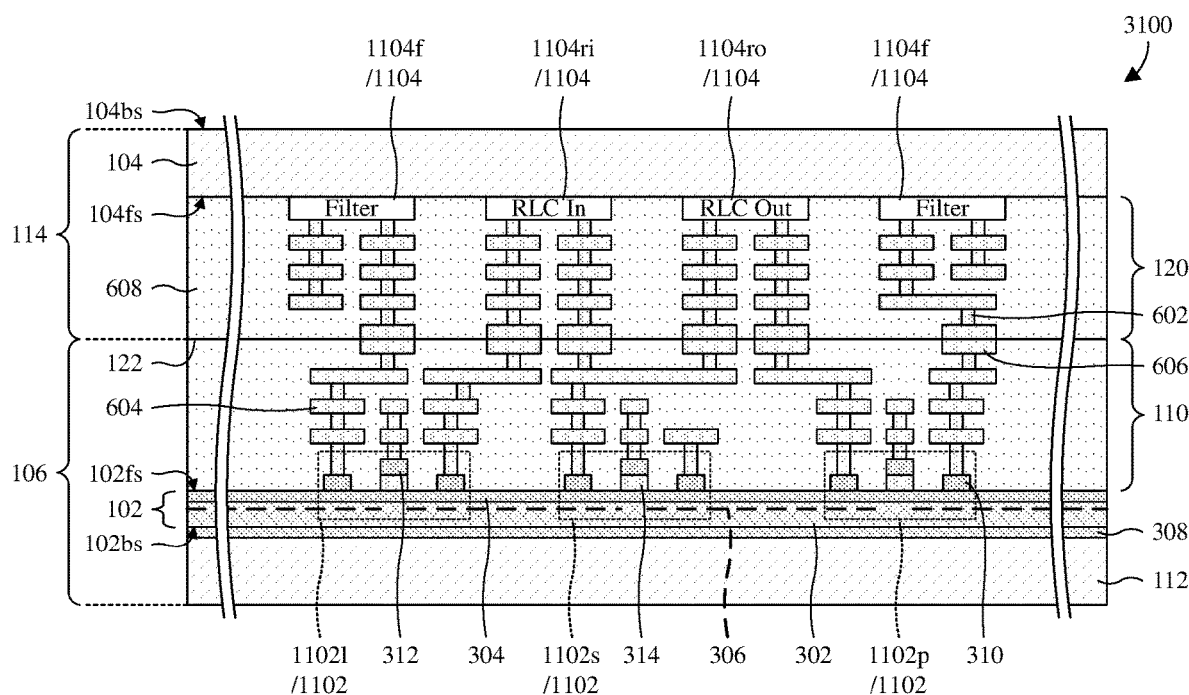

With reference to FIGS. 29-31, a series of cross-sectional views 2900-3100 of some alternative embodiments of the method of FIGS. 24-26 is provided in which semiconductor devices of the 3D IC correspond to RF. As seen hereafter, the method may, for example, be employed to form the 3D IC of FIG. 15 or some other suitable 3D IC.

As illustrated by a cross-sectional view 2900 of FIG. 29, the first IC chip 106 is formed as described with regard to FIG. 24. However, in contrast with FIG. 24 in which a first active device 108 is formed on the first semiconductor substrate 102, a plurality of first RF devices 1102 is formed on the first semiconductor substrate 102. The first RF devices 1102 may, for example, include a LNA 1102*l*, an RF switch 1102*s*, and a PA 1102*p*. Additional and/or alternative RF devices are, however, amenable.

The first RF devices 1102 are between the first semiconductor substrate 102 and the first frontside interconnect structure 110 and are partially formed by the first semiconductor substrate 102. Further, the first RF devices 1102 are or comprise HEMTs as described with regard to FIGS. 3 and 6. In alternative embodiments, one, some, or all of the first RF devices 1102 may be MOSFET(s) and/or some other suitable type(s) of active RF device. The first RF devices 1102 comprise individual pairs of source/drain electrodes 310, individual gate electrodes 312 between corresponding source/drain electrodes 310, and individual cap layers 314 separating corresponding gate electrode 312 from the first semiconductor substrate 102.

As illustrated by a cross-sectional view 3000 of FIG. 30, a second IC chip 114 is formed as described with regard to FIG. 25. However, in contrast with FIG. 25 in which second active devices 116 and passive devices 118 are formed on the second semiconductor substrate 104, a plurality of second RF devices 1104 is formed on the second semiconductor substrate 104.

The second RF devices 1104 are between the second semiconductor substrate 104 and the second frontside interconnect structure 120. In some embodiments, one, some, or all of the second RF devices 1104 is/are partially formed by the second semiconductor substrate 104. Further, in alternative embodiments, one, some, or all of the second RF devices 1104 is/are in the second frontside interconnect structure 120. The second RF devices 1104 may, for example, include a plurality of filters 1104*f*, a resistor-inductor-capacitor (RLC) input matching network 1104*ri*, an RLC output matching network 1104*ro*. Additional and/or alternative RF devices are, however, amenable. For example, the second RF devices 1104 may further include an antenna, a mixer, a local oscillator, and so on as described illustrated at FIGS. 20 and 23.

As illustrated by a cross-sectional view 3100 of FIG. 31, the second IC chip 114 is vertically flipped and is bonded to the first IC chip 106 frontside to frontside at a bond interface 122 as described with regard to FIG. 26. By bonding the first and second IC chips 106, 114 together, the first and second IC chips 106, 114 form a circuit. The circuit may, for example, be a FEM, a transceiver, a MMIC, or the like. Examples of the circuit are at FIGS. 12, 19, and 22.

As noted above, the first semiconductor substrate 102 may have a larger or wider bandgap than the second semiconductor substrate 104. To the extent that the first semiconductor substrate 102 has the larger bandgap, RF devices that benefit from the larger bandgap (e.g., the first RF devices 1102) are on and partially formed by the first semiconductor substrate 102. Active devices used for RF tend to benefit from the larger bandgap because the larger bandgap enables operation at higher frequencies, higher voltages, and higher temperatures. Further, RF devices that don't benefit or minimally benefit from the larger bandgap (e.g., the first RF devices 1104) may be formed on the second semiconductor substrate 104. At least when the second semiconductor substrate 104 is or comprises monocrystalline silicon, this may reduce cost because forming RF devices using non-silicon substrates tends to be more costly.

While the first and second IC chips 106, 114 are illustrated as being bonded together frontside to frontside, the first and second IC chips 106, 114 may alternatively be bonded together backside to frontside, frontside to backside, or backside to backside respectively as illustrated at FIGS. 16A-16C. In such alternative embodiments, the first IC chip 106 is further formed at FIG. 29 with a backside interconnect structure 202 and TSVs 204 and/or the second IC chip 114 is further formed at FIG. 30 with a backside interconnect structure 206 and TSVs 208.

While FIGS. 29-31 are described with reference to a method, it will be appreciated that the structures shown in FIGS. 29-31 are not limited to the method but rather may stand alone separate of the method. While FIGS. 29-31 are described as a series of acts, it will be appreciated that the order of the acts may be altered in other embodiments. While FIGS. 29-31 illustrate and describe as a specific set of acts, some acts that are illustrated and/or described may be omitted in other embodiments. Further, acts that are not illustrated and/or described may be included in other embodiments. For example, while FIGS. 29-31 focus on formation of the 3D IC using chip-to-chip or wafer-to-wafer bonding, the 3D IC may be alternatively formed by transferring the second semiconductor substrate 104 to the first IC chip 106 or by depositing the second semiconductor substrate 104 on the first IC chip 106. In both cases, the second RF devices 1104 and the second frontside interconnect structure 120 are be formed on the second semiconductor substrate 104 after the transfer or the deposition.

In some embodiments, the present disclosure provides a 3D IC, including: a first IC chip including a first semiconductor substrate and a first semiconductor device on and partially formed by the first semiconductor substrate; and a second IC chip including a second semiconductor substrate and a second semiconductor device on and partially formed by the second semiconductor substrate; wherein the first and second IC chips are vertically stacked and are bonded together, and wherein the first semiconductor substrate has a larger band gap than the second semiconductor substrate. In some embodiments, the first semiconductor substrate includes gallium nitride, and the second semiconductor substrate includes silicon. In some embodiments, the 3D IC further includes a power converter formed in part by the first semiconductor device and formed in part by the second semiconductor device. In some embodiments, the first and second semiconductor devices are active semiconductor devices. In some embodiments, the 3D IC further includes: a third IC chip including a third semiconductor substrate and a third semiconductor device on and partially formed by the third semiconductor substrate; and a fourth IC chip including a fourth semiconductor substrate and a fourth semiconductor device on and partially formed by the fourth semiconductor substrate; wherein the first, second, third, and fourth IC chips are vertically stacked and are bonded together, and wherein the first and third semiconductor substrates share a first common bandgap, which is larger than a second bandgap shared by the second and fourth semiconductor substrates. In some embodiments, the 3D IC further includes: a first power converter circuit formed by the first and second IC chips; and a second power converter circuit formed by the third and fourth IC chips; wherein the first and second power converter circuits are electrically coupled together in series to convert a first voltage at the first IC chip to a second voltage at the fourth IC chip, and wherein the second voltage is less than the first voltage.

In some embodiments, the present disclosure provides another 3D IC, including: a first semiconductor substrate; a first device and a first interconnect structure on the first semiconductor substrate, wherein the first device is on and partially formed by the first semiconductor substrate, and is between the first semiconductor substrate and the first interconnect structure; a second semiconductor substrate overlying the first semiconductor substrate and the first interconnect structure; and a second device and a second interconnect structure on the second semiconductor substrate, wherein the second device is between the second semiconductor substrate and the second interconnect structure; wherein the first and second semiconductor substrates respectively include different semiconductor types. In some embodiments, the first and second devices are transistors formed in part by the different semiconductor types, respectively. In some embodiments, the first semiconductor substrate includes a group III-V heterojunction structure. In some embodiments, the 3D IC further includes a RF circuit formed in part by the first and second devices and including a transceiver and/or a FEM. In some embodiments, the first device is an active device, and the second device is a passive device. In some embodiments, the second device is a RF antenna. In some embodiments, the first and second devices and the first and second interconnect structures are between the first and second semiconductor substrates. In some embodiments, the first semiconductor substrate is between the first and second interconnect structures. In some embodiments, the second semiconductor substrate is between the first and second interconnect structures.

In some embodiments, the present disclosure provides a method for forming a 3D IC, the method including: forming a first IC chip including a first semiconductor substrate and a first device on and partially formed by the first semiconductor substrate; forming a second IC chip including a second semiconductor substrate and a second device on the second semiconductor substrate; and bonding and electrically coupling the first and second IC chips together while the second IC chip overlies the first IC chip; wherein the first semiconductor substrate has a different band gap than the second semiconductor substrate. In some embodiments, the bonding including: bonding individual dielectric layers of the first and second IC chips together at a bond interface; and bonding individual metal pads of the first and second IC chips together at the bond interface. In some embodiments, the second device is partially formed by the second semiconductor substrate, which has a lesser bandgap than the first semiconductor substrate. In some embodiments, the first device is a HEMT, and the second device is a local oscillator or a mixer. In some embodiments, the first IC chip includes a support substrate on which the first semiconductor substrate is arranged, and the method further includes removing the support substrate after the bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC), comprising:
 a first IC chip comprising a first semiconductor substrate and a first semiconductor device on and partially formed by the first semiconductor substrate;
 a second IC chip comprising a second semiconductor substrate and a second semiconductor device on and partially formed by the second semiconductor substrate;
 a third IC chip and a fourth IC chip;
 a first power converter circuit formed by the first and second IC chips; and
 a second power converter circuit formed by the third and fourth IC chips;
 wherein the first, second, third, and fourth IC chips are vertically stacked and are bonded together, wherein the first semiconductor substrate has a larger band gap than the second semiconductor substrate, and wherein the first and second power converter circuits are electrically coupled together in series to convert a first voltage at the first IC chip to a second voltage less than the first voltage at the fourth IC chip.

2. The 3D IC according to claim 1, wherein the first semiconductor substrate comprises gallium nitride, and wherein the second semiconductor substrate comprises silicon.

3. The 3D IC according to claim 1, wherein the first power converter circuit is formed in part by the first semiconductor device and is formed in part by the second semiconductor device.

4. The 3D IC according to claim 1, wherein the first and second semiconductor devices are active semiconductor devices.

5. The 3D IC according to claim 1, wherein the third IC chip comprises a third semiconductor substrate and a third semiconductor device on and partially formed by the third semiconductor substrate, wherein the fourth IC chip comprises a fourth semiconductor substrate and a fourth semiconductor device on and partially formed by the fourth semiconductor substrate, and wherein the first and third semiconductor substrates share a first common bandgap, which is larger than a second bandgap shared by the second and fourth semiconductor substrates.

6. A three-dimensional (3D) integrated circuit (IC), comprising:
 a first semiconductor substrate;
 a first device and a first interconnect structure on the first semiconductor substrate, wherein the first device is on and partially formed by the first semiconductor substrate, and is between the first semiconductor substrate and the first interconnect structure;

a second semiconductor substrate overlying the first semiconductor substrate and the first interconnect structure;
a second device and a second interconnect structure on the second semiconductor substrate, wherein the second device is between the second semiconductor substrate and the second interconnect structure; and
a third semiconductor device in the first or second interconnect structure, spaced from the first and second semiconductor substrates,
wherein the first and second semiconductor substrates respectively comprise different semiconductor types.

7. The 3D IC according to claim 6, wherein the first and second devices are transistors formed in part by the different semiconductor types, respectively.

8. The 3D IC according to claim 6, wherein the first semiconductor substrate comprises a group III-V heterojunction structure.

9. The 3D IC according to claim 6, further comprising:
a radio frequency (RF) circuit formed in part by the first and second devices and comprising a transceiver and/or a front-end module (FEM).

10. The 3D IC according to claim 6, wherein the first device is an active device, and wherein the second device is a passive device.

11. The 3D IC according to claim 6, wherein the second device is a radio frequency (RF) antenna.

12. The 3D IC according to claim 6, wherein the first and second devices and the first and second interconnect structures are between the first and second semiconductor substrates.

13. The 3D IC according to claim 6, wherein the first semiconductor substrate has a wider bandgap than the second semiconductor substrate and is between the first and second interconnect structures, and wherein the 3D IC further comprises:
a through substrate via extending through the first semiconductor substrate to electrically couple the first and second interconnect structures together.

14. A method for forming a three-dimensional (3D) integrated circuit (IC), the method comprising:
forming a first IC chip comprising a first semiconductor substrate, a first device on and partially formed by the first semiconductor substrate, and a first interconnect structure;
forming a second IC chip comprising a second semiconductor substrate, and a second device on the second semiconductor substrate, and a second interconnect structure; and
bonding and electrically coupling the first and second IC chips together while the second IC chip overlies the first IC chip and while the first and second interconnect structures are between the first and second semiconductor substrates;
wherein the first semiconductor substrate has a different band gap than the second semiconductor substrate, and wherein the first and second interconnect structures each comprise multiple levels of wires and multiple levels of vias that are alternatingly and vertically stacked away from corresponding semiconductor substrates.

15. The method according to claim 14, wherein the bonding comprising:
bonding individual dielectric layers of the first and second IC chips together at a bond interface; and
bonding individual metal pads of the first and second IC chips together at the bond interface.

16. The method according to claim 14, wherein the first device is a high-electron-mobility transistor (HEMT), and wherein the second device is a local oscillator or a mixer.

17. The method according to claim 14, wherein the first IC chip comprises a support substrate on which the first semiconductor substrate is arranged, and wherein the method further comprises:
removing the support substrate after the bonding.

18. The 3D IC according to claim 6, further comprising:
a third semiconductor substrate and a fourth semiconductor substrate that are stacked with the first and second semiconductor substrates;
a first power converter on the first and second semiconductor substrates; and
a second power converter on the third and fourth semiconductor substrate,
wherein the first and second power converters are electrically coupled together in series to convert a first voltage at the first semiconductor substrate to a second voltage less than the first voltage at the fourth semiconductor substrate.

19. The 3D IC according to claim 18, wherein the first and third semiconductor substrates share a first common bandgap, which is larger than a second bandgap shared by the second and fourth semiconductor substrates.

20. The method according to claim 14, further comprising:
forming a third IC chip and a fourth IC chip; and
bonding the third and fourth IC chips to the second IC chip with the third IC chip being between the second and fourth IC chips,
wherein the first and second IC chips are formed with a first power converter circuit, wherein the third and fourth IC chips are formed with a second power converter circuit, and wherein the first and second power converter circuits are electrically coupled together in series to convert a first voltage at the first IC chip to a second voltage less than the first voltage at the fourth IC chip.

* * * * *